United States Patent
Kliegel

(10) Patent No.: US 7,209,873 B1
(45) Date of Patent: Apr. 24, 2007

(54) METHOD OF ANALYZING AND COMPUTING ANISOTROPIC TURBULENT FLOWS

(76) Inventor: James R. Kliegel, 12392 Country La., Santa Ana, CA (US) 92705

( * ) Notice: Subject to any disclaimer, the term of this patent is extended or adjusted under 35 U.S.C. 154(b) by 582 days.

(21) Appl. No.: 09/654,214

(22) Filed: Sep. 1, 2000

Related U.S. Application Data

(60) Provisional application No. 60/152,391, filed on Sep. 3, 1999.

(51) Int. Cl.
*G06G 7/50* (2006.01)
(52) U.S. Cl. .................. 703/9; 257/16; 342/5; 356/128; 703/2; 703/6
(58) Field of Classification Search ................ 357/15, 357/16; 342/5; 257/16; 356/128; 703/6, 703/9, 2
See application file for complete search history.

(56) References Cited

U.S. PATENT DOCUMENTS 5,121,985 A * 6/1992 Albrecht et al. ............ 356/128

OTHER PUBLICATIONS

A.M. Poskanzer and S.A. Voloshin, "Methods for analyzing anisotropic flow in relativistic nuclear collisons", Dec. 11, 2001 Nuclear Science Division, Lawrence Berkeley National Laboratory, Berkeley, CA, Draft 3.9.*

Peter N. Blossey and John L. Lumley, "Reduced-order modelling and control of near-wall turbulent flow" Dec. 1999, Proceedings of the 13th Conference on Decision & Control.*

Alexey Rylov, wlodzimierz Czernuszenko, "A Simple Model for Anisotropic Turbulent Flow in Open Channels", Aug. 31, 1998, Model Validation:Currents and Waves.*

James R. Kliegel and Victor Quan, "Convergent-Divergent Nozzle Flows" Sep. 1968, AIAA-Journal, vol. 6, No. 9, p. 1728-34.*

James R. Kliegel, "Maxwell Boltzmann Gas Dynamics", 1991, Rarefield Gas Dynamics.*

Shiyi Chen and Gary D. Dooler, "Latice Boltzmann Method for Fluid Flows", 1998, Annu. Rev. Fluid Mech. vol. 30, p. 329-64.*

Renwei Lei, Li-Shi Lou, and Wei Shyy, "An Accurate Curved Boundary Treatment in the Lattice Boltzmann Method" Feb. 2, 1999, Journal of Computational Physics, vol. 155 p. 307-330.*

1990, Kliegel, J.R., *Maxwell Boltzmann Gas Dynamics*, Proceedings of the 17th International Symposium on Rarefied Gas Dynamics, Aachen 1990, Edited by Alfred E. Beylich, VCH, New York.

* cited by examiner

*Primary Examiner*—Kamini Shah
*Assistant Examiner*—Herng-der Day
(74) *Attorney, Agent, or Firm*—Blakely, Sokoloff, Taylor & Zafman, LLP

(57) ABSTRACT

A general, closed, anisotropic kinetic turbulence theory for gases and liquids is based on new solutions of the Maxwell moment equations of the Boltzmann equations. These solutions provide a closed initial equation set for the four time average fluid mechanic variables, the sixteen time average thermal motion correlation and the sixteen time average turbulent motion correlations listed in Table I.

2 Claims, No Drawings

METHOD OF ANALYZING AND COMPUTING ANISOTROPIC TURBULENT FLOWS

RELATED APPLICATION

This application claims priority from now abandoned provisional application Ser. No. 60/152,391 filed Sep. 3, 1999.

BACKGROUND OF THE INVENTION

1. Field of the Invention

This invention relates generally to the field of fluid dynamics. More particularly, the invention is a method for accurately and efficiently analyzing anisotropic turbulent flows of both gases and liquids.

2. Background

The study and engineering application of hydraulics or fluid mechanics dates to the dawn of civilization. The first irrigation canals were constructed before 5,000 BC. Theoretical analysis of fluid motions began in the modem scientific sense with Newton's *Principia* (1687) and his laws of motion. Bernoulli (1738) established a relationship between the pressure and velocity of an ideal fluid which became his famous theorem. d'Alembert (1744) deduced that the steady flow of an ideal fluid about a body produces no drag (d'Alembert's Paradox). Euler (1755) founded modem fluid mechanic analyses by deriving the differential equations of motion (continuity and momentum conservation) for an ideal (inviscid) isotropic fluid. Navier (1822) and Stokes (1845) independently derived the viscous terms necessary to extend Euler's equations to isotropic, viscous fluids. The equation of state and the conservation of energy equation (First Law of Thermodynamics) written utilizing Fourier's (1822) law of thermal energy transfer completed the classical Navier Stokes equations governing isotropic fluid motions.

Reynolds (1883) experimentally showed that there are two modes of fluid motion, laminar and turbulent motion, which occurs at large values of the dimensionless Reynolds number. Reynolds (1894), by considering a time average motion and a time dependent turbulent motion, showed that turbulent motions introduce additional turbulent (Reynolds) stresses into the Navier Stokes equations, greatly increasing the number of flow properties required to describe turbulent flows.

Despite over a century of intense aircraft and aerospace developments, wind tunnel and laboratory experiments, theoretical analyses and numerical computations based on the Navier Stokes equations, the determination of a general theory of turbulent motion remains one of the last great unsolved problems of classical physics.

Maxwell (1858) founded modern kinetic theory when he introduced his new concept of the molecule velocity distribution function and deduced its equilibrium form. Maxwell (1867) derived the Maxwell transport equations and showed that the collision change integrals could be solved analytically without knowing the molecule velocity distribution function for Maxwell molecules. Boltzmann (1872) derived his integro-differential equation for Maxwell's molecular velocity distribution function and solved for his famous H-theorem, which proved that Maxwell's equilibrium form was correct. Chapman (1916), using Maxwell's transport equations, determined accurate general formulae for the gas transport coefficients. Enskog (1917) gave a general solution method for the Boltzmann equation, which showed that the Euler equations were the first and the Navier Stokes equations were the second approximate solutions to the Boltzmann equation and gave gas transport coefficients identical to Chapman's. Both the Chapman and Enskog analyses were for isotropic perfect gases, being based on perturbations of Maxwell's isotropic equilibrium solution. Their independent analyses cemented the belief in both the scientific and particularly the engineering professions that the Navier Stokes equations were generally and universally valid and that the correct way of analyzing both laminar and turbulent flows was through the Navier Stokes equations. This belief has been engraved in stone in both the scientific and engineering literature throughout the 20th century.

Burnett (1935) derived the third approximate solution to the Boltzmann equations using Enskog's solution method. Grad (1949) derived a thirteen moment method of solving Boltzmann's equation which closely followed Enskog's methods. Both of these analyses have been proven to lack generality and have not been significant advances of the Navier Stokes theory. Bird (1963) introduced the Direct Simulation Monte Carlo (DSMC) numerical method for calculating rarified gas flows. Yen (1966) showed that the directional thermal energies (temperatures) were vastly different in shock waves and that the longitudinal temperature overshot its downstream value for shock Mach numbers greater than $$\sqrt{\frac{9}{5}} \ (1.34).$$

Elliot and Baganoff (1974) showed that the Navier Stokes normal stress relationship and the Fourier energy flux component ratio were valid only in sound waves and were invalid at the shock end points. Elliot (1975) showed that the Navier Stokes normal stress relationship was invalid everywhere in shock waves and incompatible with the directional thermal kinetic energy moments of the Boltzmann equation. DSMC numerical shock calculations confirmed all of these analytical predictions and numerically illustrated the anisotropic not isotropic fluid features of many simple gas flows.

Kliegel (1990), following a suggestion of Maxwell (1867) that near equilibrium flows were anisotropic and should be represented by an anisotropic, not isotropic Maxwellian, performed the first general anisotropic solution analysis of the Boltzmann equation. Kliegel (1990) showed that the Euler-Navier Stokes-Burnett equation sequence was not the correct approximate solution sequence for the Boltzmann equation. He showed that the correct gas dynamic equation set was an anisotropic fluid seven equation set for the density, three fluid velocity components and three directional thermal kinetic energies (temperatures), not the classic isotropic fluid five equation Euler-Navier Stokes set for the density, three fluid velocity components and total temperature. He also gave shear and directional energy flux relationship having the correct Mach number dependence for both sound waves and weak shocks. Kliegel's anisotropic equations resolved d'Alembert's paradox giving a profile pressure drag associated with pushing an ideal (shearless, energy fluxless) fluid about a body. They also correctly predicted the directional thermal energy separations and overshoots and the thermal energy flux component changes occurring in shock waves as predicted by Yen (1966) and numerical DSMC shock calculations. Bird (1994) summarizes recent DSMC calculational capabilities. Chen and Jaw (1998) presented a recent summary of classical isotropic fluid Navier Stokes based turbulent flow modelling.

The present disclosure correctly consolidates all previous fluid dynamic and kinetic theory analyses and extends it to define a new method of analyzing and computing anisotropic turbulent flows.

The prior art cited above may be found in the following references:

1. 1687, Newton, I. *Philosophiae Naturalis Principia Mathematica*, Oxford.
2. 1738, Bernoulli, D., *Hydrodynamica sive de Viribus et Motibus Fluidorum Commentarii*, Berlin.
3. 1744, d'Alembert, J., *Traite de l'equilibre et du mouvement des fluides pour servir de suite au traité de dynamique*, Paris.
4. 1755, Euler, L., *Principles généreaux du mouvement des fluides*, Histoire de l'Academie de Berlin.
5. 1822, Navier, L. M. H., *Mémoires de l'Academie des Sciences de l'Institut de France*, V 6, p. 389, Paris.
6. 1822, Fourier, J., *Théorie analytique de la chaleur*, Paris.
7. 1845, Stokes, G. G., *On the Theory of the Internal Friction of Fluids in Motion*, Transactions of the Cambridge Philosophical Society, V8, p. 287, Cambridge.
8. 1858, Maxwell, J. C., *Illustrations of the Dynamical Theory of Gases*, Philosophical Magazine, V 19, p. 19 and V20, p. 21.
9. 1867, Maxwell, J. C., *On the Dynamical Theory of Gases*, Philosophical Transactions of the Royal Society, V 157, p. 49.
10. 1872, Boltzmann, L., *Weitere Studien über das Wärmegleichgewicht unter Gasmolekülen*, Styungsberichte, Akad. Wiss, Vienna, Part II, V 66, p. 275.
11. 1883, Reynolds, O., *An Experimental Investigation of the Circumstances which Determine whether the Motion of Water Shall Be Direct or Sinuous, and the Law of Resistance in Parallel Channels*, Philosophical Transactions of the Royal Society, V174, p. 935.
12. 1895, Reynolds, O., *On the Dynamical Theory of Incompressible Viscous Fluids and the Determination of the Criterion*, Philosophical Transactions of the Royal Society, V186A, p. 123.
13. 1904, Prandth, L., *Uber Flüssigkeitsbewegung bei sehr kleiner Reibung*, Proceedings of the Third International Mathematical Conference, Heidelberg, Leipzig.
14. 1916, Chapman, S., *The Kinetic Theory of Simple and Composite Monotonic Gases: Viscosity, Thermal Conduction, and Diffusion*, Proceedings of the Royal Society London, A, V 93, p. 1.
15. 1917, Enskog, D., *Kinetische Theory der Vorgänge in mässig verdunnten Gasen*, Almquist & Wilsells, Uppsala, Sweden.
16. 1935 Burnett, D., *The Distribution of Molecular Velocities and the Mean Motion in a Non-Uniform Gas*, Proceedings London Mathematical Society, V 40, p. 382.
17. 1949, Grad, H., *On the Kinetic Theory of Rarefied Gases*, Convention of Pure and Applied Mathematics, V 2, p. 331.
18. 1963, Bird, G. A., *Approach to Translational Equilibrium in a Rigid Sphere Gas*, Physics of Fluids, V 6, p. 1518.
19. 1966, Yen, S-M, *Temperature Overshoot in Shock Waves*, Physics of Fluids, V9, p. 1417.
20. 1970, Chapman, S., Cowling, T. G., *Mathematical Theory of Non-Uniform Gases*, Third Edition, Cambridge University Press.
21. 1974, Elliot, J. P., Baganoff, D., *Solution of the Boltzmann Equation at the Upstream and Downstream Singular Points in a Shock Wave*, Journal of Fluid Mechanics, V 65, p. 603.
22. 1975, Elliot, J. P., *On the Validity of the Navier-Stokes Relation in a Shock Wave*, Canadian Journal of Physics, V 53, p. 583.
23. 1990, Kliegel, J. R., *Maxwell Boltzmann Gas Dynamics*, Proceedings of the 17$^{th}$ International Symposium on Rarefied Gas Dynamics, Aachen 1990, Edited by Alfred E. Beylich, VCH, New York.
24. 1994, Bird, G. A., *Molecular Gas Dynamics and the Direct Simulation of Gas Flows*, Oxford University Press, New York.
25. 1998, Chen, C-J. Jaw, S-Y, *Fundamentals of Turbulence Modeling*, Taylor & Francis, Washington.

SUMMARY OF THE INVENTION

This disclosure concerns a simple method of deriving the correct kinetic anisotropic fluid turbulent flow equations from the Boltzmann equation and the correct thermal and turbulent moment closures to yield a new, closed set of fluid dynamic equations describing anisotropic turbulent motions, solving the old quest for the solution to this classical problem.

Current turbulent flow analyses are based on the isotropic Navier Stokes equations, turbulent fluctuation moments of these equations and modeling of the unknown turbulent moments, identifying introduced unknown modeling coefficients by experiment. This results in a variety of semi-empirical turbulent flow analyses based on different Navier Stokes moment relationships satisfying mass, momentum and total energy conservation for an isotropic fluid, calibrated to approximately match a limited number of experiments. The limitations of current Navier Stokes based turbulent analyses are well known and appear to be irresolvable after a century of intense analytical and experimental effort.

The present invention provides a general, closed, anisotropic kinetic turbulence theory for gases and liquids based on new solutions of the Maxwell moment equations of the Boltzmann equations. These solutions provide a closed initial equation set for the four time average fluid mechanic variables, the sixteen time average thermal motion correlation and the sixteen time average turbulent motion correlations listed in Table I. Higher order closure sets involving higher order (fourth and fifth, etc.) thermal and turbulent moment sets are easily generated allowing solutions of turbulent flow problems to higher and higher accuracy if desired or needed for special problems. These higher order sets will not be further discussed since they add only unnecessary detail to the disclosure and reveal little that is new.

An algebraic differential equation solution method described in my co-pending application entitled "Method for Algebraically Solving Differential Equations, including Stiff Equations, to High Accuracy" may be used to reduce the thirty six governing differential equations to the solution of as few as six differential equations (continuity, momentum, total energy and turbulent energy) plus thirty algebraic relationships. The actual equation set solved depends on the problem and accuracy desired.

The presented analytic anisotropic turbulence theory is mathematically correct, involving no semi-empirical modeling. The even order higher order moment closures involved are general and correct to known accuracy. The analysis can be used to solve the infinite set of Maxwell moment equations to any level desired to verify the accuracy of the initial closure set.

The anisotropic kinetic turbulence theory presented allows the calculation of turbulent motions with the same accuracy and computer resources as current laminar flow calculations.

The new teachings of the present invention may be summarized as follows:
1. A closed turbulence theory may be simply derived directly from the Boltzmann equation without turbulent correlation modelling or experimentally determined modelling coefficients.
2. Turbulent flows are totally inviscid flows, unchanged by molecular collisions.
3. Turbulence is universal, having the same governing equations and the same physical structure in both gases and liquids because turbulence is an inviscid flow phenomena described entirely by inviscid convective flow equations, independent of collisions and molecular interaction laws.
4. The fact that time average turbulent flow correlation between turbulent flow fluctuations and density or thermal velocity correlations are zero because there is no physical (collisional) connection between these fluctuations, since both the turbulent flow fluctuations and density are conserved in collisions.
5. A method of analyzing the Maxwell moment equations to obtain a closed set of equations which describe time average turbulent flows to any desired accuracy level. All higher moment equation above the closure level can be solved in even/odd sets of two, thus yielding solutions to all Maxwell moment equations with error of Burnett order or less.
6. Direct predictions of turbulent transition locations, turbulent energy growth rates, shears and other thermal and turbulent flow quantities of physical importance can now be derived or calculated from solution of the presented equations with the same accuracy and computer resources as current laminar flow analyses or calculations.
7. Universal even order thermal and turbulent moment closure relationships exist and are explicitly given, allowing the termination and solution of the Maxwell moment equations at any desired odd moment equation set, and solution of the Boltzmann equation to any desired approximation.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

The Boltzmann equation may be written in fluid dynamic collision rate form: [See Equation set 1];

where $$\frac{D}{Dt} = [\rho F(v)]$$

is the Lagrangian convective motion derivative, $\rho$ is the fluid density, $\upsilon$ is the molecular collision rate, $F(v)$ is the molecular velocity (v) distribution function and $F(v)^*$ is the molecular velocity distribution function collided into $F(v)$. There is no approximation in writing the Boltzmann collision integral in this format, since the required thermal velocity moments of $F(v)^*$ are correctly calculated from the full Boltzmann collision integral (Kliegel (1990)). The molecular collision rate is $$\upsilon = \rho K$$

for Maxwell molecules, where K is a molecular collision constant.

The illustrative derivation will be done for Maxwell molecules for simplicity, since the collision change integrals are known exactly for Maxwell molecules. The same derivation can be performed for any molecular model, it is just more algebraically complex and adds nothing to the teachings.

Both the original Enskog (1917) solution as a perturbation about the equilibrium Maxwellian and the Kliegel (1990) solution as a perturbation about a non-equilibrium anisotropic Maxwellian are Navier Stokes order accurate $$\left(\frac{1}{\upsilon^2} \text{ Burnett order error terms}\right)$$

Burnett order error terms) and do not depend on density gradients. Thus, density gradient corrections to the molecular velocity distribution function and its moments belong to the Burnett order of corrections. This important fact, although present in the result of both analyses, is explicitly stated by neither author nor utilized to further extend or simplify the analyses.

Multiplying the Boltzmann equation by the molecular velocity product $v_1^l v_2^m v_3^n$, where l, m, n are integers, and integrating over all possible velocities (indicated by the bar) yields the Maxwell molecular velocity moment equation: [See Equation Set 2]. Derivation of the anisotropic turbulent flow equations from this equation will be discussed later.

Consider the molecular velocity (v) to be composed of a mass mean fluid flow velocity (u) and a thermal motion velocity (c), then the Cartesian components of these velocities are related by $$v_1 = u_1 + c_1$$

Multiplying the Boltzmann equation by the thermal velocity product $c_1^l c_2^m c_3^n$, where l, m and n are integers, and integrating over all possible thermal velocities (indicated by the bar) yields the Maxwell thermal velocity moment equation: [See Equation Set 3].

For odd moment ($l+m+n=2N+1$, N integer) equations, the coefficients of the density gradient terms are even moments and products of lower even moments, which have equilibrium values. Thus these even moment coefficients must be zero to Burnett order for the density gradient terms to be of Burnett order. This requirement yields the general even order (fourth, sixth and higher) density gradient independent thermal moment closure relationships: [See Equation Set 4].

The fourth order thermal moment closure relationships can also obtained from Kliegel (1990) by simple calculation but he did not state these results nor utilize them in any manner. Substituting these relationships into Equation Set 3, one obtains the closed odd order (third, fifth and higher) density gradient independent thermal moment equation. [See Equation Set 5].

The classical Maxwell thermal velocity twenty moment equation set is: [See Equation Set 6].

After using the fourth order moment density gradient independent closure relationships: [See Equation Set 7], the closed directional thermal energy flux and structure equations become: [See Equation Set 8] where the fourth order thermal moments have been replaced by products of second order moments through the fourth order density gradient independent closure relationships.

The above set of equations are the correct anisotropic gas dynamic flow equations with neglected terms of Burnett order in the convective terms of the closed thermal energy flux and structure equations. All other equations in the set are exact. These equations resolve the known deficiencies of the Euler-Navier Stokes-Burnett equation sets, d'Alembert's paradox, the normal stress incompatibility, the incorrect Mach number dependency of the Navier Stokes normal stress and Fourier energy flux components, and the incorrect coordinate rotation variance of the Burnett equations. These equations are valid for both sound waves and weak shocks, and thus will accurately predict all flows except in those regions of high change rates in distances comparable to the mean free path length, such as occur in strong shock waves and at boundaries in very rarified flows.

The twenty moment equations may be further simplified by performing an Enskog-type ordering analysis on all terms to obtain the reduced equation set: [See Equation Set 9]

One can extend the above analysis to time average turbulent flows by considering the mass mean fluid flow velocity (u) to be composed of a time average velocity ($\bar{u}$), and a turbulent motion velocity (u'), like Reynolds (1894). The Cartesian components of these velocities are related by:

$$u_1 = \bar{u}_1 + u'_1$$

where now $$v_1 = \bar{u}_1 + u'_1 + c_1$$

The turbulent motion (u') is inviscid, unaffected by collisions since the mean flow velocity (u) is conserved in collisions and only the thermal (c) velocities are changed in collisions. This important fact has not been previously recognized, explicitly stated or utilized in the scientific/engineering literature. Since both the density and turbulent motion are preserved in collisions, there is no collisional (physical) coupling between turbulent motion fluctuations, density fluctuations and thermal velocity correlation fluctuations. Thus, there is no time average correlation between these fluctuations. The averaging time required for the time average correlations between turbulent velocity fluctuations and molecular (number density and thermal motion correlation) fluctuations to be essentially zero is quite short, since the molecular fluctuations occur on a collisional time scale of nanoseconds and turbulent flow fluctuations occur on much larger fluid dynamic time scales (typically measured in milliseconds or greater). Thus, the time dependent time average anisotropic turbulent flow equations presented can be used to compute turbulent flows changing on fluid dynamic time scales for the vast majority of engineering flows. The time change adequacy of the time average anisotropic turbulent flow equations needs to be verified for extremely rapid flow changes such as those associated with shocks, flames and deteriorations. The only turbulent flow variables necessary to analyze anisotropic turbulent flows in the vast majority of physical cases are those given in Table I below, all other time average correlations being zero.

TABLE I

Turbulent Flow Variables

| Fluid Dynamic | | Thermal Moments | | Turbulent Moments | |
|---|---|---|---|---|---|
| $\bar{\rho}$ | (1) | $\overline{\overline{c_1^2}}$ | (3) | $\overline{u'_1{}^2}$ | (3) |
| $\bar{u}_1$ | (3) | $\overline{\overline{c_1 c_2}}$ | (3) | $\overline{u'_1 u'_2}$ | (3) |
| | | $\overline{\overline{c_1 c_1^2}}$ | (3) | $\overline{u'_1 u'_1{}^2}$ | (3) |
| | | $\overline{\overline{c_1 c_2^2}}$ | (6) | $\overline{u'_1 u'_2{}^2}$ | (6) |
| | | $\overline{\overline{c_1 c_2 c_3}}$ | (1) | $\overline{u'_1 u'_2 u'_3}$ | (1) |
| Four Fluid Dynamic Variables | | Sixteen Thermal Moment Variables | | Sixteen Turbulent Moment Variables | |

The time average turbulent flow variables are the flow density ($\bar{\rho}$) where the bar indicates time averaging, the three mass mean velocity components ($\bar{u}_1$), the three anisotropic thermal kinetic energies ($\overline{\overline{c_1^2}}$, where the two bars indicate both time averaging and averaging over all thermal velocities), the three thermal shear components ($\overline{\overline{c_1 c_2}}$) the nine thermal kinetic energy fluxes ($\overline{\overline{c_1 c_1^2}}$ and $\overline{\overline{c_1 c_2^2}}$) the thermal structure correlation ($\overline{\overline{c_1 c_2 c_3}}$) the three anisotropic turbulent kinetic energies ($\overline{u'_1{}^2}$) the three turbulent shear components ($\overline{u'_1 u'_2}$) the nine turbulent kinetic energy fluxes ($\overline{u'_1 u'_1{}^2}$ and $\overline{u'_1 u'_2{}^2}$) and the turbulent structure correlation ($\overline{u'_1 u'_2 u'_3}$).

The instantaneous Maxwell molecular velocity (v) and the thermal velocity (c) moment equations (Equation Sets 2 and 3) are both valid at every instant of time and the instantaneous Maxwell thermal velocity moment equations can be derived from the instantaneous Maxwell molecular velocity moment equations. The time average Maxwell molecular velocity (v) and time average thermal velocity (c) moment equations are also both valid simultaneously. The time average thermal velocity equations yield equations governing the behavior of the anisotropic time average thermal directional kinetic energies, shears, directional kinetic energy fluxes and structure correlations: [See Equation Set 10].

The time average molecular velocity equations yield equations governing mass and momentum conservation and the behavior of both the time average thermal and turbulent directional energies, shears, energy fluxes and structure correlations: [See Equations Set 11].

After eliminating the collision change terms with the time average thermal Maxwell moment equations and other simplifications, one obtains the equations governing the behavior of the anisotropic time average turbulent directional kinetic energies, shears, directional energy fluxes and structure correlations: [See Equation Set 12].

Both sets of third order directional kinetic energy fluxes and structure correlation equations are closed using the fourth order density gradient independent time average thermal and turbulent moment closure relationships: [See Equation Sets 13 and 14].

One thus obtains the complete closed Maxwell twenty moment equation set governing anisotropic time average turbulent flows: [See Equation Set 15].

By the same process, corresponding higher order time average turbulent moment equation sets may be derived using higher order closure relationships. The general density gradient independent time average thermal and turbulent even moment closure relationships are: [See Equation Sets 16 and 17].

These closures allow the infinite set of time average Maxwell moment equations governing turbulent flows to be closed at any desired odd order level starting at the third order. If one closes at the third order (say), then one can solve all higher order moment sets (fourth and fifth, six and seventh, etc.) in order, where the errors are still of Burnett order in the convective terms of the highest order moment equations (fifth, seventh, etc.) considered in the set. The method thus allows solution of all the Maxwell moment equations, both those sets below and above the chosen closure level.

The above results may be simply extended in many ways. For example, the general even order density gradient independent moment closure relationships (Equation Set 4) are valid in equilibrium. Thus, [See Equation Set 18] and the even order collision integrals ($\overline{c_1^{l+1}c_2^m c_3^n}* - \overline{c_1^{l+1}c_2^m c_3^n}$, etc.) may be calculated for all molecular models.

It will be recognized that the above-described invention may be embodied in other specific forms without departing from the spirit or essential characteristics of the disclosure. Specifically, the anisotropic turbulent flow equations may be reformatted and/or approximated and computed in many different ways to solve specific problems. Obvious first steps would be to add gravitational forces or to sum the directional turbulent energy equations to obtain a total turbulent energy equation or to reduce the complexity of the equation set through a Prandtl (1904) boundary layer analysis. The analysis presented (valid for monatomic perfect gases) can be expanded to diatomic (and polyatomic) gases, gas mixtures, reacting gas mixtures, plasmas, etc. through known methods, Chapman and Cowling (1970). The analysis can be extended to isotropic fluids by setting the three directional thermal kinetic energies $\overline{c_1^2}$ or $\overline{c_1^2}$ equal, and solving only the summed total thermal energy equation, rather than the three directional thermal kinetic equations. Since this reduces the Equation Set 9 to the Navier Stokes equations, Kliegel (1990), the analysis can be extended to liquids by setting both the three directional thermal kinetic energies equal and the density constant. The closed anisotropic turbulent flow equation set can be utilized with existing Reynolds averaged Navier Stokes equation solvers to solve incompressible isotropic fluid problems. Thus, it is understood that the invention is not to be limited by the foregoing illustrative details, but rather is to be defined by the appended claims.

While all equation sets may be solved by straightforward computation, they may be more efficiently solved using the method described in my co-pending application entitled "Method for Algebraically Solving Differential Equations, Including Stiff Equations, to High Accuracy" Ser. No. 09/654,004 filed Sep. 1, 2000.

Equation Set 1

(1-1)

$$\frac{D}{Dt}[\rho F(v)] = \frac{\partial}{\partial t}[\rho F(v)] + v_1 \frac{\partial}{\partial x_1}[\rho F(v)] + v_2 \frac{\partial}{\partial x_2}[\rho F(v)] + v_3 \frac{\partial}{\partial x_3}[\rho F(v)]$$

$$= \rho v[F(v)^* - F(v)]$$

Equation Set 2

(2-1)

$$\frac{\partial}{\partial t}[\rho \overline{v_1^l v_2^m v_3^n}] + \frac{\partial}{\partial x_1}[\rho \overline{v_1^{l+1} v_2^m v_3^n}] + \frac{\partial}{\partial x_2}[\rho \overline{v_1^l v_2^{m+1} v_3^n}] + \frac{\partial}{\partial x_3}[\rho \overline{v_1^l v_2^m v_3^{n+1}}] = \rho v[\overline{v_1^l v_2^m v_3^n}^* - \overline{v_1^l v_2^m v_3^n}]$$

where $\overline{v_1^l v_2^m v_3^n}$ is the instantaneous molecular velocity moment $v_1^l v_2^m v_3^n$ averaged over $F(v)$ and $\overline{v_1^l v_2^m v_3^n}*$ is the instantaneous scattered molecular velocity moment $v_1^l v_2^m v_3^n$ averaged over $F(v)*$.

Equation Set 3

(3-1)

$$\frac{\partial}{\partial t}[\overline{c_1^l c_2^m c_3^n}] + u_1 \frac{\partial}{\partial x_1}[\overline{c_1^l c_2^m c_3^n}] + u_2 \frac{\partial}{\partial x_2}[\overline{c_1^l c_2^m c_3^n}] +$$

$$u_3 \frac{\partial}{\partial x_3}[\overline{c_1^l c_2^m c_3^n}] - l\overline{c_1^{l-1} c_2^m c_3^n}\left[\frac{\partial}{\partial x_1}[\overline{c_1^2}] + \frac{\partial}{\partial x_2}[\overline{c_1 c_2}] + \frac{\partial}{\partial x_3}[\overline{c_1 c_3}]\right] -$$

$$m\overline{c_1^l c_2^{m-1} c_3^n}\left[\frac{\partial}{\partial x_1}[\overline{c_1 c_2}] + \frac{\partial}{\partial x_2}[\overline{c_2^2}] + \frac{\partial}{\partial x_3}[\overline{c_2 c_3}]\right] -$$

$$n\overline{c_1^l c_2^m c_3^{n-1}}\left[\frac{\partial}{\partial x_1}[\overline{c_1 c_3}] + \frac{\partial}{\partial x_2}[\overline{c_2 c_3}] + \frac{\partial}{\partial x_3}[\overline{c_3^2}]\right] +$$

$$l\left[\overline{c_1^l c_2^m c_3^n}\frac{\partial u_1}{\partial x_1} + \overline{c_1^{l-1} c_2^{m+1} c_3^n}\frac{\partial u_1}{\partial x_2} + \overline{c_1^{l-1} c_2^m c_3^{n+1}}\frac{\partial u_1}{\partial x_3}\right] +$$

$$m\left[\overline{c_1^{l+1} c_2^{m-1} c_3^n}\frac{\partial u_2}{\partial x_1} + \overline{c_1^l c_2^m c_3^n}\frac{\partial u_2}{\partial x_2} + \overline{c_1^l c_2^{m-1} c_3^{n+1}}\frac{\partial u_2}{\partial x_3}\right] +$$

$$n\left[\overline{c_1^{l+1} c_2^m c_3^{n-1}}\frac{\partial u_3}{\partial x_1} + \overline{c_1^l c_2^{m+1} c_3^{n-1}}\frac{\partial u_3}{\partial x_2} + \overline{c_1^l c_2^m c_3^n}\frac{\partial u_3}{\partial x_3}\right] +$$

$$\frac{\partial}{\partial x_1}[\overline{c_1^{l+1} c_2^m c_3^n}] + \frac{\partial}{\partial x_2}[\overline{c_1^l c_2^{m+1} c_3^n}] + \frac{\partial}{\partial x_3}[\overline{c_1^l c_2^m c_3^{n+1}}] + [\overline{c_1^{l+1} c_2^m c_3^n} -$$

$$l(\overline{c_1^2})\overline{c_1^{l-1} c_2^m c_3^n} - m[\overline{c_1 c_2}]\overline{c_1^l c_2^{m-1} c_3^n} - n[\overline{c_1 c_3}]\overline{c_1^l c_2^m c_3^{n-1}}]\frac{1}{\rho}$$

$$\frac{\partial \rho}{\partial x_1} + [\overline{c_1^l c_2^{m+1} c_3^n} - l(\overline{c_1 c_2})\overline{c_1^{l-1} c_2^m c_3^n} - m[\overline{c_2^2}]\overline{c_1^l c_2^{m-1} c_3^n} - n[\overline{c_2 c_3}]\overline{c_1^l c_2^m c_3^{n-1}}]$$

$$\frac{1}{\rho}\frac{\partial \rho}{\partial x_2} + [\overline{c_1^l c_2^m c_3^{n+1}} - l[\overline{c_1 c_3}]\overline{c_1^{l-1} c_2^m c_3^n} - m[\overline{c_2 c_3}]\overline{c_1^l c_2^{m-1} c_3^n} -$$

$$n[\overline{c_3^2}]\overline{c_1^l c_2^m c_3^{n-1}}]\frac{1}{\rho}\frac{\partial \rho}{\partial x_3} = v[\overline{c_1^l c_2^m c_3^n}^* - \overline{c_1^l c_2^m c_3^n}]$$

where $\overline{c_1^l c_2^m c_3^n}$ is the instantaneous thermal velocity moment $c_1^l c_2^m c_3^n$ averaged over $F(v)$, and $\overline{c_1^l c_2^m c_3^n}*$ is the instantaneous scattered thermal velocity moment $c_1^l c_2^m c_3^n$ averaged over $F(v)*$. The latter may be calculated from the full Boltzmann collision change integrals, Kliegel (1990).

Equation Set 4

(4-1); (4-2); (4-3)

$$\overline{c_1^{l+1} c_2^m c_3^n} = l[\overline{c_1^2}]\overline{c_1^{l-1} c_2^m c_3^n} + m[\overline{c_1 c_2}]\overline{c_1^l c_2^{m-1} c_3^n} + n[\overline{c_1 c_3}]\overline{c_1^l c_2^m c_3^{n-1}}$$

$$\overline{c_1^l c_2^{m+1} c_3^n} = l[\overline{c_1 c_2}]\overline{c_1^{l-1} c_2^m c_3^n} + m[\overline{c_2^2}]\overline{c_1^l c_2^{m-1} c_3^n} + n[\overline{c_2 c_3}]\overline{c_1^l c_2^m c_3^{n-1}}$$

$$\overline{c_1^l c_2^m c_3^{n+1}} = l[\overline{c_1 c_3}]\overline{c_1^{l-1} c_2^m c_3^n} + m[\overline{c_2 c_3}]\overline{c_1^l c_2^{m-1} c_3^n} + n[\overline{c_3^2}]\overline{c_1^l c_2^m c_3^{n-1}}$$

neglected terms being of Burnett order, where $l+m+n=2N+1$, an odd number.

Equation Set 5

(5-1)

$$\frac{\partial}{\partial t}[\overline{c_1^l c_2^m c_3^n}] + u_1 \frac{\partial}{\partial x_1}[\overline{c_1^l c_2^m c_3^n}] + u_2 \frac{\partial}{\partial x_2}[\overline{c_1^l c_2^m c_3^n}] +$$

$$u_3 \frac{\partial}{\partial x_3}[\overline{c_1^l c_2^m c_3^n}] + l\left[\overline{c_1^l c_2^m c_3^n}\frac{\partial u_1}{\partial x_1} + \overline{c_1^{l-l} c_2^{m+l} c_3^n}\frac{\partial u_1}{\partial x_2} + \overline{c_1^{l-l} c_2^m c_3^{n+l}}\frac{\partial u_1}{\partial x_3} + \right.$$

$$\overline{c_1^2}\frac{\partial}{\partial x_1}[\overline{c_1^{l-l} c_2^m c_3^n}] + \overline{c_1 c_2}\frac{\partial}{\partial x_2}[\overline{c_1^{l-l} c_2^m c_3^n}] + \overline{c_1 c_3}\frac{\partial}{\partial x_3}[\overline{c_1^{l-l} c_2^m c_3^n}]\right] +$$

$$m\left[\overline{c_1^{l+l} c_2^{m-l} c_3^n}\frac{\partial u_2}{\partial x_1} + \overline{c_1^l c_2^m c_3^n}\frac{\partial u_2}{\partial x_2} + \overline{c_1^l c_2^{m-l} c_3^{n+l}}\frac{\partial u_2}{\partial x_3} + \right.$$

$$\overline{c_1 c_2}\frac{\partial}{\partial x_1}[\overline{c_1^l c_2^{m-l} c_3^n}] + \overline{c_2^2}\frac{\partial}{\partial x_2}[\overline{c_1^l c_2^{m-l} c_3^n}] + \overline{c_2 c_3}\frac{\partial}{\partial x_3}[\overline{c_1^l c_2^{m-l} c_3^n}]\right] +$$

$$n\left[\overline{c_1^{l+l} c_2^m c_3^{n-l}}\frac{\partial u_3}{\partial x_1} + \overline{c_1^l c_2^{m+l} c_3^{n-l}}\frac{\partial u_3}{\partial x_2} + \overline{c_1^l c_2^m c_3^n}\frac{\partial u_3}{\partial x_3} + \overline{c_1 c_3}\frac{\partial}{\partial x_1}[\overline{c_1^l c_2^m c_3^{n-l}}] + \right.$$

$$\overline{c_2 c_3}\frac{\partial}{\partial x_2}[\overline{c_1^l c_2^m c_3^{n-l}}] + \overline{c_3^2}\frac{\partial}{\partial x_3}[\overline{c_1^l c_2^m c_3^{n-l}}]\right] = v\left[\overline{c_1^l c_2^m c_3^n}^* - \overline{c_1^l c_2^m c_3^n}\right]$$

where $l+m+n=2N+1$, an odd number and the neglected terms are of Burnett order in the convective terms (left hand side).

Equation Set 6

Twenty Moment Equations

Continuity (6-1)

$$\frac{\partial \rho}{\partial t} + \frac{\partial}{\partial x_1}[\rho u_1] + \frac{\partial}{\partial x_2}[\rho u_2] + \frac{\partial}{\partial x_3}[\rho u_3] = 0$$

Momentum (6-2)

$$\frac{\partial \rho}{\partial t}[\rho u_1] + \frac{\partial}{\partial x_1}\left[\rho[u_1^2 + \overline{c_1^2}]\right] +$$

$$\frac{\partial}{\partial x_2}[\rho[u_1 u_2 + \overline{c_1 c_2}]] + \frac{\partial}{\partial x_3} + [\rho[u_1 u_3 + \overline{c_1 c_3}]] = 0$$

Directional Thermal Energy (6-3)

$$\frac{\partial}{\partial t}[\overline{c_1^2}] + u_1\frac{\partial}{\partial x_1}[\overline{c_1^2}] + u_2\frac{\partial}{\partial x_2}[\overline{c_1^2}] +$$

$$u_3\frac{\partial}{\partial x_3}[\overline{c_1^2}] + 2\left[\overline{c_1^2}\frac{\partial u_1}{\partial x_1} + \overline{c_1 c_2}\frac{\partial u_1}{\partial x_2} + \overline{c_1 c_3}\frac{\partial u_1}{\partial x_3}\right] +$$

$$\frac{1}{\rho}\left[\frac{\partial}{\partial x_1}[\overline{\rho c_1 c_1^2}] + \frac{\partial}{\partial x_2}[\overline{\rho c_2 c_1^2}] + \frac{\partial}{\partial x_3}[\overline{\rho c_3 c_1^2}]\right] = v\left[\frac{1}{3}\overline{c^2} - \overline{c_1^2}\right]$$

Thermal Shear (6-4)

$$\frac{\partial}{\partial t}[\overline{c_1 c_2}] + u_1\frac{\partial}{\partial x_1}[\overline{c_1 c_2}] + u_2\frac{\partial}{\partial x_2}[\overline{c_1 c_2}] + u_3\frac{\partial}{\partial x_3}[\overline{c_1 c_2}] +$$

-continued $$\overline{c_1 c_2}\frac{\partial u_1}{\partial x_1} + \overline{c_2^2}\frac{\partial u_1}{\partial x_2} + \overline{c_2 c_3}\frac{\partial u_1}{\partial x_3} + \overline{c_1^2}\frac{\partial u_2}{\partial x_1} + \overline{c_1 c_2}\frac{\partial u_2}{\partial x_2} + \overline{c_1 c_3}\frac{\partial u_2}{dx_3} +$$

$$\frac{1}{\rho}\left[\frac{\partial}{\partial x_1}[\overline{\rho c_2 c_1^2}] + \frac{\partial}{\partial x_2}[\overline{\rho c_1 c_2^2}] + \frac{\partial}{\partial x_3}[\overline{\rho c_1 c_2 c_3}]\right] = -v\overline{c_1 c_2}$$

Equation Set 6

Directional Thermal Energy Fluxes (6-5)

$$\frac{\partial}{\partial t}[\overline{c_1 c_1^2}] + u_1\frac{\partial}{\partial x_1}[\overline{c_1 c_1^2}] + u_2\frac{\partial}{\partial x_2}[\overline{c_1 c_1^2}] +$$

$$u_3\frac{\partial}{\partial x_3}[\overline{c_1 c_1^2}] + 3\left[\overline{c_1 c_1^2}\frac{\partial u_1}{\partial x_1} + \overline{c_2 c_1^2}\frac{\partial u_1}{\partial x_2} + \overline{c_3 c_1^2}\frac{\partial u_1}{\partial x_3}\right] -$$

$$3\overline{c_1^2}\left[\frac{\partial}{\partial x_1}[\overline{c_1^2}] + \frac{\partial}{\partial x_2}[\overline{c_1 c_2}] + \frac{\partial}{\partial x_3}[\overline{c_1 c_3}]\right] + \frac{\partial}{\partial x_1}[\overline{c_1^2 c_1^2}] +$$

$$\frac{\partial}{\partial x_2}[\overline{c_1 c_2 c_1^2}] + \frac{\partial}{\partial x_3}[\overline{c_1 c_3 c_1^2}] + \left[\overline{c_1^2 c_1^2} - 3\overline{c_1^2}[\overline{c_1^2}]\right]$$

$$\frac{1}{\rho}\frac{\partial \rho}{\partial x_1} + \left[\overline{c_1 c_2 c_1^2} - 3\overline{c_1 c_2}[\overline{c_1^2}]\right]\frac{1}{\rho}\frac{\partial \rho}{\partial x_2} + \left[\overline{c_1 c_3 c_1^2} -\right.$$

$$\left.3\overline{c_1 c_3}[\overline{c_1^2}]\right]\frac{1}{\rho}\frac{\partial \rho}{\partial x_3}\right] = \frac{v}{2}\left[\overline{c_1 c^2} - 3\overline{c_1 c_1^2}\right]$$

Equation Set 6

(6-6)

$$\frac{\partial}{\partial t}[\overline{c_1 c_2^2}] + u_1\frac{\partial}{\partial x_1}[\overline{c_1 c_2^2}] + u_2\frac{\partial}{\partial x_2}[\overline{c_1 c_2^2}] + u_3\frac{\partial}{\partial x_3}[\overline{c_1 c_2^2}] + \overline{c_1 c_2^2}\frac{\partial u_1}{\partial x_1} +$$

$$\overline{c_2 c_2^2}\frac{\partial u_1}{\partial x_2} + \overline{c_3 c_2^2}\frac{\partial u_1}{\partial x_3} + 2\left[\overline{c_1^2 c_2}\frac{\partial u_2}{\partial x_1} + \overline{c_1 c_2^2}\frac{\partial u_2}{\partial x_2} + \overline{c_1 c_2 c_3}\frac{\partial u_2}{\partial x_3}\right] -$$

$$\overline{c_2^2}\left[\frac{\partial}{\partial x_1}[\overline{c_1^2}] + \frac{\partial}{\partial x_2}[\overline{c_1 c_2}] + \frac{\partial}{\partial x_3}[\overline{c_1 c_3}]\right] -$$

$$2\overline{c_1 c_2}\left[\frac{\partial}{\partial x_1}[\overline{c_1 c_2}] + \frac{\partial}{\partial x_2}[\overline{c_2^2}] + \frac{\partial}{\partial x_3}[\overline{c_2 c_3}]\right] + \frac{\partial}{\partial x_1}[\overline{c_1^2 c_2^2}] +$$

$$\frac{\partial}{\partial x_2}[\overline{c_1 c_2 c_2^2}] + \frac{\partial}{\partial x_3}[\overline{c_1 c_3 c_2^2}] + \left[\overline{c_1^2 c_2^2} - \overline{c_1^2}[\overline{c_2^2}]\right] -$$

$$2\overline{c_1 c_2}[\overline{c_1 c_2}]\right]\frac{1}{\rho}\frac{\partial \rho}{\partial x_1} + \left[\overline{c_1 c_2 c_2^2} - 3\overline{c_1 c_2}[\overline{c_2^2}]\right]\frac{1}{\rho}\frac{\partial \rho}{\partial x_2} + \left[\overline{c_1 c_3 c_2^2} -\right.$$

$$\left.\overline{c_1 c_3}[\overline{c_2^2}] - 2\overline{c_1 c_2}[\overline{c_2 c_3}]\right]\frac{1}{\rho}\frac{\partial \rho}{\partial x_3} = \frac{v}{2}\left[\frac{1}{3}\overline{c_2 c^2} - 3\overline{c_2 c_1^2}\right]$$

Equation Set 6

Thermal Structure (6-7)

$$\frac{\partial}{\partial t}[\overline{c_1 c_2 c_3}] + u_1\frac{\partial}{\partial x_1}[\overline{c_1 c_2 c_3}] + u_2\frac{\partial}{\partial x_2}[\overline{c_1 c_2 c_3}] +$$

$$u_3\frac{\partial}{\partial x_3}[\overline{c_1 c_2 c_3}] + \overline{c_1 c_2 c_3}\frac{\partial u_1}{\partial x_1} + \overline{c_3 c_2^2}\frac{\partial u_1}{\partial x_2} + \overline{c_2 c_3^2}\frac{\partial u_1}{\partial x_3} +$$

$$\overline{c_3 c_1^2}\frac{\partial u_2}{\partial x_1} + \overline{c_1 c_2 c_3}\frac{\partial u_2}{\partial x_2} + \overline{c_1 c_3^2}\frac{\partial u_2}{\partial x_3} + \overline{c_2 c_1^2}\frac{\partial u_3}{\partial x_1} + \overline{c_1 c_2^2}\frac{\partial u_3}{\partial x_2} +$$

-continued $$\overline{c_1 c_2 c_3} \frac{\partial u_3}{\partial x_3} - \overline{c_2 c_3} \left[ \frac{\partial}{\partial x_1} [\overline{c_1^2}] + \frac{\partial}{\partial x_2} [\overline{c_1 c_2}] + \frac{\partial}{\partial x_3} [\overline{c_1 c_3}] \right] -$$

$$\overline{c_1 c_3} \left[ \frac{\partial}{\partial x_1} [\overline{c_1 c_2}] + \frac{\partial}{\partial x_2} [\overline{c_2^2}] + \frac{\partial}{\partial x_3} [\overline{c_2 c_3}] \right] -$$

$$\overline{c_1 c_2} \left[ \frac{\partial}{\partial x_1} [\overline{c_1 c_3}] + \frac{\partial}{\partial x_2} [\overline{c_2 c_3}] + \frac{\partial}{\partial x_3} [\overline{c_3^2}] \right] +$$

$$\frac{\partial}{\partial x_1} [\overline{c_2 c_3 c_1^2}] + \frac{\partial}{\partial x_2} [\overline{c_1 c_3 c_2^2}] +$$

$$\frac{\partial}{\partial x_3} [\overline{c_1 c_2 c_3^2}] + [\overline{c_2 c_3 c_1^2} - \overline{c_2 c_3}[\overline{c_1^2}] - 2\overline{c_1 c_2}[\overline{c_2 c_3}]] \frac{1}{\rho} \frac{\partial \rho}{\partial x_1} + [\overline{c_1 c_2 c_3^2} -$$

$$\overline{c_1 c_3}[\overline{c_2^2}] - 2\overline{c_1 c_2}[\overline{c_2 c_3}]] \frac{1}{\rho} \frac{\partial \rho}{\partial x_2} + [\overline{c_1 c_2 c_3^2} -$$

$$\overline{c_1 c_2}[\overline{c_3^2}] - 2\overline{c_1 c_3}[\overline{c_2 c_3}]] \frac{1}{\rho} \frac{\partial \rho}{\partial x_3} = -\frac{3}{2} \nu \overline{c_1 c_2 c_3}$$

where $\overline{c^2} = \overline{c_1^2} + \overline{c_1^1} + \overline{c_3^2}$ and the collision change terms (right hand sides) have been calculated using the method of Kliegel (1990).

Equation Set 7

(7-1; 7-2; 7-3; 7-4)

$$\overline{c_1^2 c_1^2} = 3\overline{c_1^2}[\overline{c_1^2}]$$

$$\overline{c_1 c_2 c_1^2} = 3\overline{c_1 c_2}[\overline{c_1^2}]$$

$$\overline{c_1^2 c_2^2} = \overline{c_1^2}[\overline{c_2^2}] + 2\overline{c_1 c_2}[\overline{c_1 c_2}]$$

$$\overline{c_1 c_2 c_3^2} = \overline{c_1 c_2}[\overline{c_3^2}] + 2\overline{c_1 c_3}[\overline{c_2 c_3}]$$

Equation Set 8

Closed Directional Thermal Energy Fluxes (8-1; 8-2)

$$\frac{\partial}{\partial t} [\overline{c_1 c_1^2}] + u_1 \frac{\partial}{\partial x_1} [\overline{c_1 c_1^2}] + u_2 \frac{\partial}{\partial x_2} [\overline{c_1 c_1^2}] +$$

$$u_3 \frac{\partial}{\partial x_3} [\overline{c_1 c_1^2}] + 3 \left[ \overline{c_1 c_1^2} \frac{\partial u_1}{\partial x_1} + \overline{c_2 c_1^2} \frac{\partial u_1}{\partial x_2} + \overline{c_3 c_1^2} \frac{\partial u_1}{\partial x_3} \right] +$$

$$3 \left[ \overline{c_1^2} \frac{\partial}{\partial x_1} [\overline{c_1^2}] + \overline{c_1 c_2} \frac{\partial}{\partial x_2} [\overline{c_1^2}] + \overline{c_1 c_3} \frac{\partial}{\partial x_3} [\overline{c_1^2}] \right] = \frac{\nu}{2} [\overline{c_1 c^2} - 3\overline{c_1 c_1^2}]$$

$$\frac{\partial}{\partial t} [\overline{c_1 c_2^2}] + u_1 \frac{\partial}{\partial x_1} [\overline{c_1 c_2^2}] + u_2 \frac{\partial}{\partial x_2} [\overline{c_1 c_2^2}] + u_3 \frac{\partial}{\partial x_3} [\overline{c_1 c_2^2}] + \overline{c_1 c_2^2} \frac{\partial u_1}{\partial x_1} +$$

$$\overline{c_2 c_2^2} \frac{\partial u_1}{\partial x_2} + \overline{c_3 c_2^2} \frac{\partial u_1}{\partial x_3} + 2 \left[ \overline{c_2 c_1^2} \frac{\partial u_2}{\partial x_1} + \overline{c_1 c_2^2} \frac{\partial u_2}{\partial x_2} + \overline{c_1 c_2 c_3} \frac{\partial u_2}{\partial x_3} \right] +$$

$$\overline{c_1^2} \frac{\partial}{\partial x_1} [\overline{c_2^2}] + \overline{c_1 c_2} \frac{\partial}{\partial x_2} [\overline{c_2^2}] + \overline{c_1 c_3} \frac{\partial}{\partial x_3} [\overline{c_2^2}] +$$

$$2 \left[ \overline{c_1 c_2} \frac{\partial}{\partial x_1} [\overline{c_1 c_2}] + \overline{c_2^2} \frac{\partial}{\partial x_2} [\overline{c_1 c_2}] + \overline{c_2 c_3} \frac{\partial}{\partial x_3} [\overline{c_1 c_2}] \right] = \frac{\nu}{6} [\overline{c_1 c^2} - 9\overline{c_1 c_2^2}]$$

Equation Set 8

Closed Thermal Structure (8-3)

$$\frac{\partial}{\partial t} [\overline{c_1 c_2 c_3}] + u_1 \frac{\partial}{\partial x_1} [\overline{c_1 c_2 c_3}] + u_2 \frac{\partial}{\partial x_2} [\overline{c_1 c_2 c_3}] +$$

$$u_3 \frac{\partial}{\partial x_3} [\overline{c_1 c_2 c_3}] + \overline{c_1 c_2 c_3} \frac{\partial u_1}{\partial x_1} + \overline{c_3 c_2^2} \frac{\partial u_1}{\partial x_2} + \overline{c_2 c_3^2} \frac{\partial u_1}{\partial x_3} +$$

$$\overline{c_3 c_1^2} \frac{\partial u_2}{\partial x_1} + \overline{c_1 c_2 c_3} \frac{\partial u_2}{\partial x_2} + \overline{c_1 c_3^2} \frac{\partial u_2}{\partial x_3} + \overline{c_2 c_1^2} \frac{\partial u_3}{\partial x_1} + \overline{c_1 c_2^2} \frac{\partial u_3}{\partial x_2} +$$

$$\overline{c_1 c_2 c_3} \frac{\partial u_3}{\partial x_3} + \overline{c_1^2} \frac{\partial}{\partial x_1} [\overline{c_2 c_3}] + \overline{c_1 c_2} \frac{\partial}{\partial x_2} [\overline{c_2 c_3}] + \overline{c_1 c_3} \frac{\partial}{\partial dx_3} [\overline{c_2 c_3}] +$$

$$\overline{c_1 c_2} \frac{\partial}{\partial x_1} [\overline{c_1 c_3}] + \overline{c_2^2} \frac{\partial}{\partial x_2} [\overline{c_1 c_3}] + \overline{c_2 c_3} \frac{\partial}{\partial x_3} [\overline{c_1 c_3}] +$$

$$\overline{c_1 c_3} \frac{\partial}{\partial x_1} [\overline{c_1 c_2}] + \overline{c_2 c_3} \frac{\partial}{\partial x_2} [\overline{c_1 c_2}] + \overline{c_3^2} \frac{\partial}{\partial x_3} [\overline{c_1 c_2}] = -\frac{3}{2} \nu \overline{c_1 c_2 c_3}$$

the neglected terms are of Burnett order in the convective terms (left hand sides).

Equation Set 9

Continuity (9-1)

$$\frac{\partial \rho}{\partial t} + \frac{\partial}{\partial x_1} [\rho u_1] + \frac{\partial}{\partial x_2} [\rho u_2] + \frac{\partial}{\partial x_3} [\rho u_3] = 0$$

Momentum (9-2)

$$\frac{\partial u_1}{\partial t} + u_1 \frac{\partial u_1}{\partial x_1} + u_2 \frac{\partial u_1}{\partial x_2} + u_3 \frac{\partial u_1}{\partial x_3} +$$

$$\frac{1}{\rho} \left[ \frac{\partial}{\partial x_1} [\rho \overline{c_1^2}] + \frac{\partial}{\partial x_2} [\rho \overline{c_1 c_2}] + \frac{\partial}{\partial x_3} [\rho \overline{c_1 c_3}] \right] = 0$$

Directional Thermal Energy (9-3)

$$\frac{\partial}{\partial t} [\overline{c_1^2}] + u_1 \frac{\partial}{\partial x_1} [\overline{c_1^2}] + u_2 \frac{\partial}{\partial x_2} [\overline{c_1^2}] +$$

$$u_3 \frac{\partial}{\partial x_3} [\overline{c_1^2}] + 2 \left[ \overline{c_1^2} \frac{\partial u_1}{\partial x_1} + \overline{c_1 c_2} \frac{\partial u_1}{\partial x_2} + \overline{c_1 c_3} \frac{\partial u_1}{\partial x_3} \right] +$$

$$\frac{1}{\rho} \left[ \frac{\partial}{\partial x_1} [\rho \overline{c_1 c_1^2}] + \frac{\partial}{\partial x_2} [\rho \overline{c_2 c_1^2}] + \frac{\partial}{\partial x_3} [\rho \overline{c_3 c_1^2}] \right] = \nu \left[ \frac{1}{3} \overline{c^2} - \overline{c_1^2} \right]$$

Thermal Shear (9-4)

$$\overline{c_1 c_2} = -\frac{1}{\nu} \left[ \overline{c_2^2} \frac{\partial u_1}{\partial x_2} + \overline{c_1^2} \frac{\partial u_2}{\partial x_1} \right]$$

Directional Thermal Energy Fluxes (9-5)

$$\overline{c_1 c_1^2} = -\frac{\overline{c_1^2}}{2\nu} \left[ 7 \frac{\partial}{\partial x_1} [\overline{c_1^2}] + \frac{\partial}{\partial x_1} [\overline{c_2^2}] + \frac{\partial}{\partial x_1} [\overline{c_3^2}] \right]$$

-continued $$\overline{c_2 c_1^2} = -\frac{\overline{c_2^2}}{6\upsilon}\left[5\frac{\partial}{\partial x_2}[\overline{c_1^2}] + 3\frac{\partial}{\partial x_2}[\overline{c_2^2}] + \frac{\partial}{\partial x_2}[\overline{c_3^2}]\right]$$

Equation Set 9

Thermal Structure (9-6)

$$\overline{c_1 c_2 c_3} = 0$$

neglected terms being of Burnett order in the thermal shear, directional energy fluxes and structure. The shear stress and thermal energy flux relationships are identical to the results Kliegel (1990) obtained by an Enskog-type solution of the Boltzmann equation.

Equation Set 10

Time Average Directional Thermal Energy (10-1)

$$\frac{\partial}{\partial t}[\overline{c_1^2}] + \overline{u_1}\frac{\partial}{\partial x_1}[\overline{c_1^2}] + \overline{u_2}\frac{\partial}{\partial x_2}[\overline{c_1^2}] +$$
$$\overline{u_3}\frac{\partial}{\partial x_3}[\overline{c_1^2}] + 2\left[\overline{c_1^2}\frac{\partial \overline{u_1}}{\partial x_1} + \overline{c_1 c_2}\frac{\partial \overline{u_1}}{\partial x_2} + \overline{c_1 c_3}\frac{\partial \overline{u_1}}{\partial x_3}\right] +$$
$$\frac{1}{\overline{\rho}}\left[\frac{\partial}{\partial x_1}\left[\overline{\rho}\,\overline{c_1 c_1^2}\right] + \frac{\partial}{\partial x_2}\left[\overline{\rho}\,\overline{c_2 c_1^2}\right] + \frac{\partial}{\partial x_3}\left[\overline{\rho}\,\overline{c_3 c_1^2}\right]\right] = \overline{\upsilon}\left[\frac{1}{3}\overline{c^2} - \overline{c_1^2}\right]$$

Time Average Thermal Shear (10-2)

$$\frac{\partial}{\partial t}[\overline{c_1 c_2}] + \overline{u_1}\frac{\partial}{\partial x_1}[\overline{c_1 c_2}] + \overline{u_2}\frac{\partial}{\partial x_2}[\overline{c_1 c_2}] + \overline{u_3}\frac{\partial}{\partial x_3}[\overline{c_1 c_2}] +$$
$$\overline{c_1 c_2}\frac{\partial \overline{u_1}}{\partial x_1} + \overline{c_2^2}\frac{\partial \overline{u_1}}{\partial x_2} + \overline{c_2 c_3}\frac{\partial \overline{u_1}}{\partial x_3} + \overline{c_1^2}\frac{\partial \overline{u_2}}{\partial x_1} + \overline{c_1 c_2}\frac{\partial \overline{u_2}}{\partial x_2} + \overline{c_1 c_3}\frac{\partial \overline{u_2}}{\partial x_3} +$$
$$\frac{1}{\overline{\rho}}\left[\frac{\partial}{\partial x_1}\left[\overline{\rho}\,\overline{c_2 c_1^2}\right] + \frac{\partial}{\partial x_2}\left[\overline{\rho}\,\overline{c_1 c_2^2}\right] + \frac{\partial}{\partial x_3}\left[\overline{\rho}\,\overline{c_1 c_2 c_3}\right]\right] = -\overline{\upsilon}\,\overline{c_1 c_2}$$

Equation Set 10

Time Average Directional Thermal Energy Fluxes (10-3)

$$\frac{\partial}{\partial t}[\overline{c_1 c_1^2}] + \overline{u_1}\frac{\partial}{\partial x_1}[\overline{c_1 c_1^2}] + \overline{u_2}\frac{\partial}{\partial x_2}[\overline{c_1 c_1^2}] +$$
$$\overline{u_3}\frac{\partial}{\partial x_3}[\overline{c_1 c_1^2}] + 3\left[\overline{c_1 c_1^2}\frac{\partial \overline{u_1}}{\partial x_1} + \overline{c_2 c_1^2}\frac{\partial \overline{u_1}}{\partial x_2} + \overline{c_3 c_1^2}\frac{\partial \overline{u_1}}{\partial x_3}\right] +$$
$$3\left[\overline{c_1^2}\frac{\partial}{\partial x_1}[\overline{c_1^2}] + \overline{c_1 c_2}\frac{\partial}{\partial x_2}[\overline{c_1^2}] + \overline{c_1 c_3}\frac{\partial}{\partial x_3}[\overline{c_1^2}]\right] = \frac{\overline{\upsilon}}{2}\left[\overline{c_1 c^2} - 3\overline{c_1 c_1^2}\right]$$

Equation Set 10

Time Average Directional Thermal Energy Fluxes (10-4)

$$\frac{\partial}{\partial t}[\overline{c_1 c_2^2}] + \overline{u_1}\frac{\partial}{\partial x_1}[\overline{c_1 c_2^2}] + \overline{u_2}\frac{\partial}{\partial x_2}[\overline{c_1 c_2^2}] + \overline{u_3}\frac{\partial}{\partial x_3}[\overline{c_1 c_2^2}] + [\overline{c_1 c_2^2}]\frac{\partial \overline{u_1}}{\partial x_1} +$$
$$\overline{c_2 c_2^2}\frac{\partial \overline{u_1}}{\partial x_2} + c_3 c_2^2\frac{\partial \overline{u_1}}{\partial x_3} + 2\left[\overline{c_2 c_1^2}\frac{\partial \overline{u_2}}{\partial x_1} + \overline{c_2 c_2^2}\frac{\partial \overline{u_2}}{\partial x_2} + \overline{c_1 c_2 c_3}\frac{\partial \overline{u_2}}{\partial x_3}\right] +$$

$$2\left[\overline{c_1 c_2}\frac{\partial}{\partial x_1}[\overline{c_1 c_2}] + \overline{c_2^2}\frac{\partial}{\partial x_2}[\overline{c_1 c_2}] + \overline{c_2 c_3}\frac{\partial}{\partial x_3}[\overline{c_1 c_2}]\right] +$$
$$\overline{c_1^2}\frac{\partial}{\partial x_1}[\overline{c_2^2}] + \overline{c_1 c_2}\frac{\partial}{\partial x_2}[\overline{c_2^2}] + \overline{c_1 c_3}\frac{\partial}{\partial x_3}[\overline{c_2^2}] = \frac{\overline{\upsilon}}{2}\left[\frac{1}{3}\overline{c_2 c^2} - 3\overline{c_2 c_1^2}\right]$$

Equation Set 10

Time Average Thermal Structure (10-5)

$$\frac{\partial}{\partial t}[\overline{c_1 c_2 c_3}] + \overline{u_1}\frac{\partial}{\partial x_1}[\overline{c_1 c_2 c_3}] + \overline{u_2}\frac{\partial}{\partial x_2}[\overline{c_1 c_2 c_3}] +$$
$$\overline{u_3}\frac{\partial}{\partial x_3}[\overline{c_1 c_2 c_3}] + \overline{c_1 c_2 c_3}\frac{\partial \overline{u_1}}{\partial x_1} + \overline{c_3 c_1^2}\frac{\partial \overline{u_1}}{\partial x_2} + \overline{c_2 c_1^2}\frac{\partial \overline{u_1}}{\partial x_3} +$$
$$\overline{c_3 c_1^2}\frac{\partial \overline{u_2}}{\partial x_1} + \overline{c_1 c_2 c_3}\frac{\partial \overline{u_2}}{\partial x_2} + \overline{c_1 c_3^2}\frac{\partial \overline{u_2}}{\partial x_3} + \overline{c_2 c_1^2}\frac{\partial \overline{u_3}}{\partial x_1} + \overline{c_1 c_2^2}\frac{\partial \overline{u_3}}{\partial x_2} +$$
$$\overline{c_1 c_2 c_3}\frac{\partial \overline{u_3}}{\partial x_3} + \overline{c_1^2}\frac{\partial}{\partial x_1}[\overline{c_2 c_3}] + \overline{c_1 c_2}\frac{\partial}{\partial x_2}[\overline{c_2 c_3}] + \overline{c_1 c_3}\frac{\partial}{\partial x_3}[\overline{c_2 c_3}] +$$
$$\overline{c_1 c_2}\frac{\partial}{\partial x_1}[\overline{c_1 c_3}] + \overline{c_2^2}\frac{\partial}{\partial x_2}[\overline{c_1 c_3}] + \overline{c_2 c_3}\frac{\partial}{\partial x_3}[\overline{c_1 c_3}] +$$
$$\overline{c_1 c_3}\frac{\partial}{\partial x_1}[\overline{c_1 c_2}] + \overline{c_2 c_3}\frac{\partial}{\partial x_2}[\overline{c_1 c_2}] + \overline{c_3^2}\frac{\partial}{\partial x_3}[\overline{c_1 c_2}] = -\frac{3}{2}\overline{\upsilon}\,\overline{c_1 c_2 c_3}$$

Equation Set 11

Continuity (11-1)

$$\frac{\partial \overline{\rho}}{\partial t} + \frac{\partial}{\partial x_1}[\overline{\rho}u_1] + \frac{\partial}{\partial x_2}[\overline{\rho}u_2] + \frac{\partial}{\partial x_3}[\overline{\rho}u_3] = 0$$

Momentum (11-2)

$$\frac{\partial}{\partial t}[\overline{\rho}u_1] + \frac{\partial}{\partial x_1}\left[\overline{\rho}\left[\overline{u_1^2} + \overline{u_1'^2} + \overline{c_1^2}\right]\right] +$$
$$\frac{\partial}{\partial x_2}\left[\overline{\rho}\left[\overline{u_1 u_2} + \overline{u_1' u_2'} + \overline{c_1 c_2}\right]\right] + \frac{\partial}{\partial x_3}\left[\rho\left[\overline{u_1 u_3} + \overline{u_1' u_3'} + \overline{c_1 c_3}\right]\right] = 0$$

Turbulent Directional Energy (11-3)

$$\frac{\partial}{\partial t}\left[\overline{\rho}\left[\overline{u_1^2} + \overline{u_1'^2} + \overline{c_1^2}\right]\right] + \frac{\partial}{\partial x_1}\left[\overline{\rho}\left[\overline{u_1^3} + 3\overline{u_1}\overline{u_1'^2} + \overline{u_1' u_1'^2} + 3\overline{u_1}\overline{c_1^2} + \overline{c_1 c_1^2}\right]\right] +$$
$$\frac{\partial}{\partial x_2}\left[\overline{\rho}\left[\overline{u_2 u_1^2} + \overline{u_2}\overline{u_1'^2} + 2\overline{u_1}\overline{u_1' u_2'} + \overline{u_2' u_1'^2} + \overline{u_2}\overline{c_1^2} + 2\overline{u_1}\overline{c_1 c_2} + \overline{c_2 c_1^2}\right]\right] +$$
$$\frac{\partial}{\partial x_3}\left[\overline{\rho}\left[\overline{u_3 u_1^2} + \overline{u_3}\overline{u_1'^2} + 2\overline{u_1}\overline{u_1' u_3'} + \overline{u_3' u_1'^2} + \overline{u_3}\overline{c_1^2} + 2\overline{u_1}\overline{c_1 c_3} + \overline{c_3 c_1^2}\right]\right] =$$
$$\overline{\rho}\overline{\upsilon}\left[\frac{\overline{c^2}}{3} - \overline{c_1^2}\right]$$

Equation Set 11

Turbulent Shear (11-4)

$$\frac{\partial}{\partial t}\left[\overline{\rho}\left[\overline{u_1 u_2} + \overline{u_1' u_2'} + \overline{c_1 c_2} + \right]\right] +$$
$$\frac{\partial}{\partial x_1}\left[\overline{\rho}\left[\overline{u_2 u_1^2} + \overline{u_2 u_1'^2} + \overline{u_2' u_1'^2} + 2\overline{u_1 u_1' u_2'} + \overline{u_2}\,\overline{c_1^2} + 2\overline{u_1 c_1 c_2}\right]\right] +$$
$$\frac{\partial}{\partial x_2}\left[\overline{\rho}\left[\overline{u_2 u_2^2} + \overline{u_1 u_2'^2} + 2\overline{u_2 u_1' u_2'} + \overline{u_1' u_2'^2} + 2\overline{u_2 c_1 c_2} + \overline{u_1}\,\overline{c_2^2} + \overline{c_1 c_2^2}\right]\right] +$$
$$\frac{\partial}{\partial x_3}\left[\overline{\rho}\left[\overline{u_1 u_2 u_3} + \overline{u_3 u_1' u_2'} + \overline{u_2 u_1' u_3'} + \overline{u_1 u_2' u_3'} + \overline{u_1' u_2' u_3'} + \right.\right.$$
$$\left.\left. \overline{u_3 c_1 c_2} + \overline{u_2 c_1 c_3} + \overline{u_1 c_2 c_3} + \overline{c_1 c_2 c_3}\right]\right] = -\overline{\rho v c_1 c_2}$$

Turbulent Directional Energy Fluxes (11-5)

$$\frac{\partial}{\partial t}\left[\overline{\rho}\left[\overline{u_1}^3 + 3\overline{u_1}\,\overline{u_1'^2} + \overline{u_1' u_1'^2} + 3\overline{u_1}\,\overline{c_1^2} + \overline{c_1 c_1^2}\right]\right] +$$
$$\frac{\partial}{\partial x_1}\left[\overline{\rho}\left[\overline{u_1}^4 + 6\overline{u_1}^2 \overline{u_1'^2} + 4\overline{u_1}\,\overline{u_1' u_1'^2} + \overline{u_1'^2 u_1'^2}\right]\right] +$$
$$\frac{\partial}{\partial x_1}\left[\overline{\rho}\left[6\overline{u_1}^2 \overline{c_1^2} + 4\overline{u_1}\,\overline{c_1 c_1^2} + 6\overline{u_1'^2 c_1^2} + \overline{c_1^2 c_1^2}\right]\right] +$$
$$\frac{\partial}{\partial x_2}\left[\overline{\rho}\left[\overline{u_1}^3 u_2 + 3\overline{u_1}^2 \overline{u_1' u_2'} + 3\overline{u_1 u_2}\,\overline{u_1'^2} + \overline{u_2}\,\overline{u_1' u_1'^2} + \right.\right.$$
$$\left.\left. 3\overline{u_1}\,\overline{u_2' u_1'^2} + \overline{u_1' u_2' u_1'^2}\right]\right] + \frac{\partial}{\partial x_2}\left[\overline{\rho}\left[3\overline{u_1}^2 \overline{c_1 c_2} + 3\overline{u_1 u_2}\,\overline{c_1^2} + \right.\right.$$
$$\left.\left. \overline{u_2 c_1 c_1^2} + 3\overline{u_1}\,\overline{c_2 c_1^2} + 3\overline{u_1'^2 c_1 c_2} + 3\overline{u_1' u_2' c_1^2} + \overline{c_1 c_2 c_1^2}\right]\right] +$$
$$\frac{\partial}{\partial x_3}\left[\overline{\rho}\left[\overline{u_1}^3 \overline{u_3} + 3\overline{u_1}^2 \overline{u_1' u_3'} + 3\overline{u_1 u_3}\,\overline{u_1'^2} + \overline{u_3}\,\overline{u_1' u_1'^2} + 3\overline{u_1}\,\overline{u_3' u_1'^2} + \right.\right.$$
$$\left.\left. \overline{u_1' u_3' u_1'^2}\right]\right] + \frac{\partial}{\partial x_3}\left[\overline{\rho}\left[3\overline{u_1}^2 \overline{c_1 c_3} + 3\overline{u_1 u_3}\,\overline{c_1^2} + \overline{u_3 c_1 c_1^2} + \right.\right.$$
$$\left.\left. 3\overline{u_1}\,\overline{c_3 c_1^2} + 3\overline{u_1'^2 c_1 c_3} + 3\overline{u_1' u_3' c_1^2} + \overline{c_1 c_3 c_1^2}\right]\right] =$$
$$\overline{\rho v}\left[3\overline{u_1}\left[\frac{\overline{c^2}}{3} - \overline{c_1^2}\right] + \frac{1}{2}\left[\overline{c_1 c^2} - 3\overline{c_1 c_1^2}\right]\right]$$

Turbulent Directional Energy Fluxes (11-6)

$$\frac{\partial}{\partial t}\left[\overline{\rho}\left[\overline{u_1 u_2^2} + \overline{u_1 u_2'^2} + 2\overline{u_2 u_1' u_2'} + \overline{u_1' u_2'^2} + \overline{u_1}\,\overline{c_2^2} + 2\overline{u_2 c_1 c_2} + \overline{c_1 c_2^2}\right]\right] +$$
$$\frac{\partial}{\partial x_1}\left[\overline{\rho}\left[\overline{u_1^2 u_2^2} + \overline{u_2^2 u_1'^2} + \overline{u_1^2 u_2'^2} + 4\overline{u_1 u_2 u_1' u_2'} + \right.\right.$$
$$\left.\left. 2\overline{u_1 u_1' u_2'^2} + 2\overline{u_2 u_2' u_1'^2} + \overline{u_1'^2 u_2'^2}\right]\right] +$$
$$\frac{\partial}{\partial x_1}\left[\overline{\rho}\left[\overline{u_1^2 c_2^2} + \overline{u_2^2 c_1^2} + 4\overline{u_1 u_2 c_1 c_2} + 2\overline{u_1 c_1 c_2^2} + \overline{u_1'^2 c_2^2} + \right.\right.$$
$$\left.\left. 2\overline{u_2 c_2 c_1^2} + \overline{u_2'^2 c_1^2} + 4\overline{u_1' u_2' c_1 c_2} + \overline{c_1^2 c_2^2}\right]\right] + \frac{\partial}{\partial x_2}\left[\overline{\rho}\left[\overline{u_1 u_2^3} + \right.\right.$$
$$\left.\left. 3\overline{u_2^2 u_1' u_2'} + 3\overline{u_1 u_2}\,\overline{u_2'^2} + \overline{u_1}\,\overline{u_2' u_2'^2} + 3\overline{u_2}\,\overline{u_1' u_2'^2} + \overline{u_1' u_2' u_2'^2}\right]\right] +$$
$$\frac{\partial}{\partial x_2}\left[\overline{\rho}\left[3\overline{u_2^2 c_1 c_2} + 3\overline{u_1 u_2}\,\overline{c_2^2} + \overline{u_1 c_2 c_2^2} + 3\overline{u_2 c_1 c_2^2} + \right.\right.$$
$$\left.\left. 3\overline{u_2'^2 c_1 c_2} + 3\overline{u_1' u_2' c_2^2} + \overline{c_1 c_2 c_2^2}\right]\right] +$$
$$\frac{\partial}{\partial x_3}\left[\overline{\rho}\left[\overline{u_1 u_3 u_2^2} + \overline{u_1 u_3 u_2'^2} + \overline{u_2^2 u_1' u_3'} + 2\overline{u_1 u_2 u_2' u_3'} + \right.\right.$$

-continued $$2\overline{u_2 u_3 u_1' u_2'} + 2\overline{u_2 u_1' u_2' u_3'} + \overline{u_1 u_3}\,\overline{u_2'^2} + \overline{u_3}\,\overline{u_1' u_2'^2} + \overline{u_1' u_3' u_2'^2} +$$
$$\frac{\partial}{\partial x_3}\left[\overline{\rho}\left[\overline{u_1'^2 c_2 c_3} + \overline{u_1 u_3}\,\overline{c_2^2} + 2\overline{u_1 u_2 c_2 c_3} + 2\overline{u_2 u_3 c_1 c_2} + \right.\right.$$
$$\left.\left. \overline{u_1 c_3 c_2^2} + 2\overline{u_2 c_1 c_2 c_3} + \overline{u_3 c_1 c_2^2}\right]\right] + \frac{\partial}{\partial x_3}\left[\overline{\rho}\left[\overline{u_2'^2 c_1 c_3} + \right.\right.$$
$$\left.\left. 2\overline{u_1' u_2' c_2 c_3} + \overline{u_1' u_3' c_2^2} + 2\overline{u_2' u_3' c_1 c_2} + \overline{c_1 c_3 c_2^2}\right]\right] =$$
$$\overline{\rho v}\left[\overline{u_1}\left[\frac{\overline{c^2}}{3} - \overline{c_1^2}\right] - 2\overline{u_2 c_1 c_2} + \frac{1}{6}\left[\overline{c_1 c^2} - 9\overline{c_1 c_1^2}\right]\right]$$

Turbulent Structure (11-7)

$$\frac{\partial}{\partial t}\left[\overline{\rho}\left[\overline{u_1 u_2 u_3} + \overline{u_3 c_1 c_2} + \overline{u_2 c_1 c_3} + \overline{u_1 c_2 c_3} + \right.\right.$$
$$\left.\left. \overline{c_1 c_2 c_3} + \overline{u_3 u_1' u_2'} + \overline{u_2 u_1' u_3'} + \overline{u_1 u_2' u_3'} + \overline{u_1' u_2' u_3'}\right]\right] +$$
$$\frac{\partial}{\partial x_1}\left[\overline{\rho}\left[\overline{u_2 u_3 u_1^2} + \overline{u_1^2 u_2' u_3'} + 2\overline{u_1 u_2 u_1' u_3'} + 2\overline{u_1 u_3 u_1' u_2'} + \right.\right.$$
$$\left.\left. \overline{u_2 u_3 u_1'^2} + 2\overline{u_1 u_1' u_2' u_3'} + \overline{u_2 u_3' u_1'^2} + \overline{u_3 u_2' u_1'^2}\right]\right] +$$
$$\frac{\partial}{\partial x_1}\left[\overline{\rho}\left[\overline{u_1' u_3' u_1'^2} + \overline{u_1^2 c_2 c_3} + 2\overline{u_1 u_3 c_1 c_2} + \overline{u_2 u_3}\,\overline{c_1^2} + \right.\right.$$
$$\left.\left. 2\overline{u_1 u_2 c_1 c_3} + 2\overline{u_1 c_1 c_2 c_3} + \overline{u_2 c_3 c_1^2} + \overline{u_3 c_2 c_1^2}\right]\right] +$$
$$\frac{\partial}{\partial x_1}\left[\overline{\rho}\left[\overline{u_1'^2 c_2 c_3} + 2\overline{u_1' u_2' c_1 c_3} + 2\overline{u_1' u_3' c_1 c_2} + \overline{u_2' u_3'}\,\overline{c_1^2} + \overline{c_2 c_3 c_1^2}\right]\right] +$$
$$\frac{\partial}{\partial x_2}\left[\overline{\rho}\left[\overline{u_1 u_3 u_2^2} + \overline{u_2^2 u_1' u_3'} + 2\overline{u_1 u_2 u_2' u_3'} + 2\overline{u_2 u_3 u_1' u_2'} + \right.\right.$$
$$\left.\left. \overline{u_1 u_3}\,\overline{u_2'^2} + 2\overline{u_2 u_1' u_2' u_3'} + \overline{u_1 u_3' u_2'^2} + \overline{u_3 u_1' u_2'^2}\right]\right] +$$
$$\frac{\partial}{\partial x_2}\left[\overline{\rho}\left[\overline{u_1' u_3' u_2'^2} + \overline{u_2^2 c_1 c_3} + 2\overline{u_2 u_3 c_1 c_2} + \overline{u_1 u_3}\,\overline{c_2^2} + \right.\right.$$
$$\left.\left. 2\overline{u_1 u_2 c_2 c_3} + 2\overline{u_2 c_1 c_2 c_3} + \overline{u_1 c_3 c_2^2} + \overline{u_3 c_1 c_2^2}\right]\right] +$$
$$\frac{\partial}{\partial x_2}\left[\overline{\rho}\left[\overline{u_2'^2 c_1 c_3} + 2\overline{u_1' u_2' c_2 c_3} + 2\overline{u_2' u_3' c_1 c_2} + \overline{u_1' u_3'}\,\overline{c_2^2} + \overline{c_1 c_3 c_2^2}\right]\right] +$$
$$\frac{\partial}{\partial x_3}\left[\overline{\rho}\left[\overline{u_1 u_2 u_3^2} + \overline{u_3^2 u_1' u_2'} + 2\overline{u_2 u_3 u_1' u_3'} + 2\overline{u_1 u_3 u_2' u_3'} + \right.\right.$$
$$\left.\left. \overline{u_1 u_2}\,\overline{u_3'^2} + 2\overline{u_3 u_1' u_2' u_3'} + \overline{u_2 u_1' u_3'^2} + \overline{u_1 u_2' u_3'^2}\right]\right] +$$
$$\frac{\partial}{\partial x_3}\left[\overline{\rho}\left[\overline{u_1' u_2' u_3'^2} + \overline{u_3^2 c_1 c_2} + 2\overline{u_1 u_3 c_2 c_3} + \overline{u_1 u_2}\,\overline{c_3^2} + \right.\right.$$
$$\left.\left. 2\overline{u_2 u_3 c_1 c_3} + 2\overline{u_3 c_1 c_2 c_3} + \overline{u_2 c_1 c_3^2} + \overline{u_1 c_2 c_3^2}\right]\right] +$$
$$\frac{\partial}{\partial x_3}\left[\overline{\rho}\left[\overline{u_3'^2 c_1 c_2} + 2\overline{u_2' u_3' c_1 c_3} + 2\overline{u_1' u_3' c_2 c_3} + \overline{u_1' u_2'}\,\overline{c_3^2} + \overline{c_1 c_2 c_3^2}\right]\right] =$$
$$\overline{\rho v}\left[\overline{u_1 c_2 c_3} + \overline{u_2 c_1 c_3} + \overline{u_3 c_1 c_2} + \frac{3}{2}\overline{c_1 c_2 c_3}\right]$$

Equation Set 12

Directional Turbulent Energy (12-1)

$$\frac{\partial}{\partial t}\left[\overline{u_1'^2}\right] + \overline{u_1}\frac{\partial}{\partial x_1}\left[\overline{u_1'^2}\right] + \overline{u_2}\frac{\partial}{\partial x_2}\left[\overline{u_1'^2}\right] +$$
$$\overline{u_3}\frac{\partial}{\partial x_3}\left[\overline{u_1'^2}\right] + 2\left[\overline{u_1'^2}\frac{\partial \overline{u_1}}{\partial x_1} + \overline{u_1' u_2'}\frac{\partial \overline{u_1}}{\partial x_2} + \overline{u_1' u_3'}\frac{\partial \overline{u_1}}{\partial x_3}\right] +$$

-continued $$\frac{1}{\overline{\rho}}\left[\frac{\partial}{\partial x_1}\left[\overline{\rho}\overline{u'_1 u'^2_1}\right] + \frac{\partial}{\partial x_2}\left[\overline{\rho}\overline{u'_2 u'^2_1}\right] + \frac{\partial}{\partial x_3}\left[\overline{\rho}\overline{u'_3 u'^2_1}\right]\right] = 0$$

Turbulent Shear (12-2)

$$\frac{\partial}{\partial t}[\overline{u'_1 u'_2}] + \overline{u_1}\frac{\partial}{\partial x_1}[\overline{u'_1 u'_2}] + \overline{u_2}\frac{\partial}{\partial x_2}[\overline{u'_1 u'_2}] + \overline{u_3}\frac{\partial}{\partial x_3}[\overline{u'_1 u'_2}] +$$

$$\overline{u'_1 u'_2}\frac{\partial \overline{u_1}}{\partial x_1} + \overline{u'^2_2}\frac{\partial \overline{u_1}}{\partial x_2} + \overline{u'_2 u'_3}\frac{\partial \overline{u_1}}{\partial x_3} + \overline{u'^2_1}\frac{\partial \overline{u_2}}{\partial x_1} + \overline{u'_1 u'_2}\frac{\partial \overline{u_2}}{\partial x_2} +$$

$$\overline{u'_1 u'_3}\frac{\partial \overline{u_2}}{\partial x_3} + \frac{1}{\overline{\rho}}\left[\frac{\partial}{\partial x_1}\left[\overline{\rho}\overline{u'_2 u'^2_1}\right] + \frac{\partial}{\partial x_2}\left[\overline{\rho}\overline{u'_1 u'^2_2}\right] + \frac{\partial}{\partial x_3}\left[\overline{\rho}\overline{u'_1 u'_2 u'_3}\right]\right] = 0$$

Equation Set 12

Directional Turbulent Energy Fluxes (12-3)

$$\frac{\partial}{\partial t}[\overline{u'_1 u'^2_1}] + \overline{u_1}\frac{\partial}{\partial x_1}[\overline{u'_1 u'^2_1}] + \overline{u_2}\frac{\partial}{\partial x_2}[\overline{u'_1 u'^2_1}] +$$

$$\overline{u_3}\frac{\partial}{\partial x_3}[\overline{u'_1 u'^2_1}] + 3\left[\overline{u'^2_1 u'^2_1}\frac{\partial \overline{u_1}}{\partial x_1} + \overline{u'_2 u'^2_1}\frac{\partial \overline{u_1}}{\partial x_2} + \overline{u'_3 u'^2_1}\frac{\partial \overline{u_1}}{\partial x_3}\right] -$$

$$3\overline{u'^2_1}\left[\frac{\partial}{\partial x_1}[\overline{u'^2_1}] + \frac{\partial}{\partial x_2}[\overline{u'_1 u'_2}] + \frac{\partial}{\partial x_3}[\overline{u'_1 u'_3}]\right] +$$

$$3\overline{c'^2_1}\left[\frac{\delta}{\delta x_1}[\overline{u'^2_1}] + \frac{\partial}{\partial x_2}[\overline{u'_1 u'_2}] + \frac{\partial}{\partial x_3}[\overline{u'_1 u'_3}]\right] +$$

$$3\left[\overline{u'^2_1}\frac{\partial}{\partial x_1}[\overline{c'^2_1}] + \overline{u'_1 u'_2}\frac{\partial}{\partial x_2}[\overline{c'^2_1}] + \overline{u'_1 u'_3}\frac{\partial}{\partial x_3}[\overline{c'^2_1}]\right] +$$

$$\frac{\partial}{\partial x_1}[\overline{u'^2_1 u'^2_1}]\frac{\partial}{\partial x_2}[\overline{u'_1 u'_2 u'^2_1}] + \frac{\partial}{\partial x_3}[\overline{u'_1 u'_3 u'^2_1}] +$$

$$\left[\overline{u'^2_1 u'^2_1} - 3\overline{u'^2_1}[\overline{u'^2_1}]\right]\frac{1}{\overline{\rho}}\frac{\partial \overline{\rho}}{\partial x_1} + \left[\overline{u'_1 u'_2 u'^2_1} - 3\overline{u'_1 u'_2}[\overline{u'^2_1}]\right]\frac{1}{\overline{\rho}}\frac{\partial \overline{\rho}}{\partial x_2} + \left[\overline{u'_1 u'_3 u'^2_1} - 3\overline{u'_1 u'_3}[\overline{u'^2_1}]\right]\frac{1}{\overline{\rho}}\frac{\partial \overline{\rho}}{\partial x_3} = 0$$

Equation Set 12

Directional Turbulent Energy Fluxes (12-4)

$$\frac{\partial}{\partial t}[\overline{u'_1 u'^2_2}] + \overline{u_2}\frac{\partial}{\partial x_2}[\overline{u'_1 u'^2_2}] + \overline{u_1}\frac{\partial}{\partial x_1}[\overline{u'_1 u'^2_2}] + \overline{u_3}\frac{\partial}{\partial x_3}[\overline{u'_1 u'^2_2}] +$$

$$2\left[\overline{u'_1 u'^2_2}\frac{\partial \overline{u_2}}{\partial x_2} + \overline{u'^2_1 u'_2}\frac{\partial \overline{u_2}}{\partial x_1} + \overline{u'_1 u'_2 u'_3}\frac{\partial \overline{u_2}}{\partial x_3}\right] + \overline{u'^2_2 u'_2}\frac{\partial \overline{u_1}}{\partial x_2} + \overline{u'_2 u'^2_1}\frac{\partial u_1}{\partial x_1} +$$

$$\overline{u'_3 u'^2_1}\frac{\partial u_1}{\partial x_3} - 2\overline{u'_1 u'_2}\left[\frac{\partial}{\partial x_1}[\overline{u'^2_2}] + \frac{\partial}{\partial x_1}[\overline{u'_1 u'_2}] + \frac{\partial}{\partial x_3}[\overline{u'_2 u'_3}]\right] -$$

$$\overline{u'^2_2}\left[\frac{\partial}{\partial x_2}[\overline{u'_1 u'_2}] + \frac{\partial}{\partial x_1}[\overline{u'^2_1}] + \frac{\partial}{\partial x_3}[\overline{u'_1 u'_3}]\right] +$$

$$2\left[\overline{c'^2_2}\frac{\partial}{\partial x_1}[\overline{u'_1 u'_2}] + \overline{c_1 c_2}\frac{\partial}{\partial x_1}[\overline{u'_1 u'_2}] + \overline{c_2 c_3}\frac{\partial}{\partial x_3}[\overline{u'_1 u'_2}]\right] +$$

$$\overline{c_1 c_2}\frac{\partial}{\partial x_2}[\overline{u'^2_2}] + \overline{c'^2_1}\frac{\partial}{\partial x_1}[\overline{u'^2_2}] + \overline{c_1 c_3}\frac{\partial}{\partial x_3}[\overline{u'^2_2}] +$$

$$2\left[\overline{u'^2_2}\frac{\partial}{\partial x_2}[\overline{u'_1 u'_2}] + \overline{u'_1 u'_2}\frac{\partial}{\partial x_1}[\overline{u'_1 u'_2}] + \overline{u'_2 u'_3}\frac{\partial}{\partial x_3}[\overline{u'_1 u'_2}]\right] + \overline{u'_1 u'_2}\frac{\partial}{\partial x_2}[\overline{c'^2_2}] +$$

$$\overline{u'^2_1}\frac{\partial}{\partial x_1}[\overline{c'^2_2}] + \overline{u'_1 u'_3}\frac{\partial}{\partial x_3}[\overline{c'^2_1}] + \frac{\partial}{\partial x_2}[\overline{u'_1 u'_2 u'^2_2}] + \frac{\partial}{\partial x_1}[\overline{u'^2_1 u'^2_2}] +$$

$$\frac{\partial}{\partial x_3}[\overline{u'_1 u'_3 u'^2_2}] + \left[\overline{u'_1 u'_2 u'^2_2} - 3\overline{u'_1 u'_2}[\overline{u'^2_2}]\right]\frac{1}{\overline{\rho}}\frac{\partial \overline{p}}{\partial x_2} + \left[\overline{u'^2_1 u'^2_2} - \overline{u'^2_1}[\overline{u'^2_2}]\right] -$$

$$2\overline{u'_1 u'_2}[\overline{u'_1 u'_2}]\right]\frac{1}{\overline{\rho}}\frac{\partial \overline{p}}{\partial x_1} + \left[\overline{u'_1 u'_3 u'^2_2} - \overline{u'_1 u'_3}[\overline{u'^2_2}] - 2\overline{u'_1 u'_2}[\overline{u'_2 u'_3}]\right]\frac{1}{\overline{\rho}}\frac{\partial \overline{p}}{\partial x_3} = 0$$

Equation Set 12

Turbulent Structure (12-5)

$$\frac{\partial}{\partial t}[\overline{u'_1 u'_2 u'_3}] + \overline{u_1}\frac{\partial}{\partial x_1}[\overline{u'_1 u'_2 u'_3}] + \overline{u_2}\frac{\partial}{\partial x_2}[\overline{u'_1 u'_2 u'_3}] +$$

$$\overline{u_3}\frac{\partial}{\partial x_3}[\overline{u'_1 u'_2 u'_3}] + \overline{u'_1 u'_2 u'_3}\frac{\partial \overline{u_1}}{\partial x_1} + \overline{u'_3 u'^2_2}\frac{\partial \overline{u_2}}{\partial x_2} + \overline{u'_2 u'^2_3}\frac{\partial \overline{u_1}}{\partial x_3} +$$

$$\overline{u'_3 u'^2_1}\frac{\partial \overline{u_2}}{\partial x_1} + \overline{u'_1 u'_2 u'_3}\frac{\partial \overline{u_2}}{\partial x_2} + \overline{u'_1 u'^2_3}\frac{\partial \overline{u_2}}{\partial x_3} + \overline{u'_2 u'^2_1}\frac{\partial \overline{u_3}}{\partial x_1} + \overline{u'_1 u'^2_2}\frac{\partial \overline{u_2}}{\partial x_3} +$$

$$\overline{u'_1 u'_2 u'_3}\frac{\partial \overline{u_3}}{\partial x_3} - \overline{u'_1 u'_2}\left[\frac{\partial}{\partial x_1}[\overline{u'_1 u'_3}] + \frac{\partial}{\partial x_2}[\overline{u'_2 u'_3}] + \frac{\partial}{\partial x_3}[\overline{u'^2_3}]\right] -$$

$$\overline{u'_1 u'_3}\left[\frac{\partial}{\partial x_1}[\overline{u'_1 u'_3}] + \frac{\partial}{\partial x_2}[\overline{u'^2_2}] + \frac{\partial}{\partial x_3}[\overline{u'_2 u'_3}]\right] -$$

$$\overline{u'_2 u'_3}\left[\frac{\partial}{\partial x_1}[\overline{u'^2_1}] + \frac{\partial}{\partial x_2}[\overline{u'_1 u'_2}] + \frac{\partial}{\partial x_3}[\overline{u'_1 u'_3}]\right] +$$

$$\overline{u'^2_1}\frac{\partial}{\partial x_1}[\overline{c_2 c_3}] + \overline{u'_1 u'_2}\frac{\partial}{\partial x_2}[\overline{c_2 c_3}] + \overline{u'_1 u'_3}\frac{\partial}{\partial x_3}[\overline{c_2 c_3}] +$$

$$\overline{u'_1 u'_2}\frac{\partial}{\partial x_1}[\overline{c_1 c_3}] + \overline{u'^2_2}\frac{\partial}{\partial x_2}[\overline{c_1 c_3}] + \overline{u'_2 u'_3}\frac{\partial}{\partial x_3}[\overline{c_1 c_3}] +$$

Equation Set 13 (13-1; 13-3; 13-4)

$$\overline{c'^2_1 c'^2_1} = 3\overline{c'^2_1}[\overline{c'^2_1}]$$

$$\overline{c_1 c_2 c'^2_1} = 3\overline{c_1 c_2}[\overline{c'^2_1}]$$

$$\overline{c'^2_1 c'^2_2} = \overline{c'^2_1}[\overline{c'^2_2}] + 2\overline{c_1 c_2}[\overline{c_1 c_2}]$$

$$\overline{c_1 c_2 c'^2_3} = \overline{c_1 c_2}[\overline{c'^2_3}] + 2\overline{c_1 c_3}[\overline{c_2 c_3}]$$

neglected terms being of Burnett order.

Equation Set 14 (14-1; 14-2; 14-3; 14-4)

$$\overline{u'^2_1 u'^2_1} = 3\overline{u'^2_1}[\overline{u'^2_1}]$$

$$\overline{u'_1 u'_2 u'^2_1} = 3\overline{u'_1 u'_2}[\overline{u'^2_1}]$$

$$\overline{u'^2_1 u'^2_2} = \overline{u'^2_1}[\overline{u'^2_2}] + 2\overline{u'_1 u'_2}[\overline{u'_1 u'_2}]$$

$$\overline{u'_1 u'_2 u'^2_3} = \overline{u'_1 u'_2}[\overline{u'^2_3}] + 2\overline{u'_1 u'_3}[\overline{u'_2 u'_3}]$$

neglected terms being of Burnett order.

Equation Set 15

Time Average Continuity (15-1)

$$\frac{\partial \overline{\rho}}{\partial t} + \frac{\partial}{\partial x_1}[\overline{\rho}\overline{u_1}] + \frac{\partial}{\partial x_2}[\overline{\rho}\overline{u_2}] + \frac{\partial}{\partial x_3}[\overline{\rho}\overline{u_3}] = 0$$

Time Average Momentum (15-2)

$$\frac{\partial}{\partial t}[\bar{\rho}\bar{u}_1] + \frac{\partial}{\partial x_1}\left[\bar{\rho}\left[\bar{u}_1^2 + \overline{u_1'^2} + \overline{c_1^2}\right]\right] +$$

$$\frac{\partial}{\partial x_2}\left[\bar{\rho}\left[\overline{u_1 u_2} + \overline{u_1' u_2'} + \overline{c_1 c_2}\right]\right] + \frac{\partial}{\partial x_3}\left[\bar{\rho}\left[\overline{u_1 u_3} + \overline{u_1' u_3'} + \overline{c_1 c_3}\right]\right] = 0$$

Equation Set 15

Time Average Directional Thermal Energy (15-3)

$$\frac{\partial}{\partial t}[\overline{c_1^2}] + \bar{u}_1 \frac{\partial}{\partial x_1}[\overline{c_1^2}] + \bar{u}_2 \frac{\partial}{\partial x_2}[\overline{c_1^2}] +$$

$$\bar{u}_3 \frac{\partial}{\partial x_3}[\overline{c_1^2}] + 2\left[\overline{c_1^2}\frac{\partial \bar{u}_1}{\partial x_1} + \overline{c_1 c_2}\frac{\partial u_1}{\partial x_2} + \overline{c_1 c_3}\frac{\partial u_1}{\partial x_3}\right] +$$

$$\frac{1}{\bar{\rho}}\left[\frac{\partial}{\partial x_1}\left[\overline{\rho c_1 c_1^2}\right] + \frac{\partial}{\partial x_2}\left[\overline{\rho c_2 c_1^2}\right] + \frac{\partial}{\partial x_3}\left[\overline{\rho c_3 c_1^2}\right]\right] = \bar{v}\left[\frac{1}{3}\overline{c^2} - \overline{c_1^2}\right]$$

Time Average Thermal Shear (15-4)

$$\frac{\partial}{\partial t}[\overline{c_1 c_2}] + \bar{u}_1 \frac{\partial}{\partial x_1}[\overline{c_1 c_2}] + \bar{u}_2 \frac{\partial}{\partial x_2}[\overline{c_1 c_2}] + \bar{u}_3 \frac{\partial}{\partial x_3}[\overline{c_1 c_2}] +$$

$$\overline{c_1 c_2}\frac{\partial \bar{u}_1}{\partial x_1} + \overline{c_2^2}\frac{\partial \bar{u}_1}{\partial x_2} + \overline{c_2 c_3}\frac{\partial \bar{u}_1}{\partial x_3} + \overline{c_1^2}\frac{\partial \bar{u}_2}{\partial x_1} + \overline{c_1 c_2}\frac{\partial \bar{u}_2}{\partial x_2} + \overline{c_1 c_3}\frac{\partial \bar{u}_2}{\partial x_3} +$$

$$\frac{1}{\bar{\rho}}\left[\frac{\partial}{\partial x_1}\left[\overline{\rho c_2 c_1^2}\right] + \frac{\partial}{\partial x_2}\left[\overline{\rho c_1 c_2^2}\right]\frac{\partial}{\partial x_3}\left[\overline{\rho c_1 c_2 c_3}\right]\right] = -\bar{v}\,\overline{c_1 c_2}$$

Equation Set 15

Closed Time Average Directional Thermal Energy Fluxes (15-5)

$$\frac{\partial}{\partial t}[\overline{c_1 c_1^2}] + \bar{u}_1 \frac{\partial}{\partial x_1}[\overline{c_1 c_1^2}] + \bar{u}_2 \frac{\partial}{\partial x_2}[\overline{c_1 c_1^2}] +$$

$$\bar{u}_3 \frac{\partial}{\partial x_3}[\overline{c_1 c_1^2}] + 3\left[\overline{c_1 c_1^2}\frac{\partial u_1}{\partial x_1} + \overline{c_2 c_1^2}\frac{\partial u_1}{\partial x_2} + \overline{c_3 c_1^2}\frac{\partial u_1}{\partial x_3}\right] +$$

$$3\left[\overline{c_1^2}\frac{\partial}{\partial x_1}[\overline{c_1^2}] + \overline{c_1 c_2}\frac{\partial}{\partial x_2}[\overline{c_1^2}] + \overline{c_1 c_3}\frac{\partial}{\partial x_3}[\overline{c_1^2}]\right] = \frac{\bar{v}}{2}\left[\overline{c_1 c^2} - 3\overline{c_1 c_1^2}\right]$$

(15-6)

$$\frac{\partial}{\partial t}[\overline{c_1 c_2^2}] + \bar{u}_1 \frac{\partial}{\partial x_1}[\overline{c_1 c_2^2}] + \bar{u}_2 \frac{\partial}{\partial x_2}[\overline{c_1 c_2^2}] + \bar{u}_3 \frac{\partial}{\partial x_3}[\overline{c_1 c_2^2}] + \overline{c_1 c_2^2}\frac{\partial \bar{u}_1}{\partial x_1} +$$

$$\overline{c_2 c_2^2}\frac{\partial \bar{u}_1}{\partial x_2} + \overline{c_3 c_2^2}\frac{\partial \bar{u}_1}{\partial x_3} + 2\left[\overline{c_2 c_1^2}\frac{\partial \bar{u}_2}{\partial x_1} + \overline{c_1 c_2^2}\frac{\partial \bar{u}_2}{\partial x_2} + \overline{c_1 c_2 c_3}\frac{\partial \bar{u}_2}{\partial x_3}\right] +$$

$$2\left[\overline{c_1 c_2}\frac{\partial}{\partial x_1}[\overline{c_1 c_2}] + \overline{c_2^2}\frac{\partial}{\partial x_2}[\overline{c_1 c_2}] + \overline{c_2 c_3}\frac{\partial}{\partial x_3}[\overline{c_1 c_2}]\right] +$$

$$\overline{c_1^2}\frac{\partial}{\partial x_1}[\overline{c_2^2}] + \overline{c_1 c_2}\frac{\partial}{\partial x_2}[\overline{c_2^2}] + \overline{c_1 c_3}\frac{\partial}{\partial x_3}[\overline{c_2^2}] = \frac{\bar{v}}{2}\left[\frac{1}{3}\overline{c_2 c^2} - 3\overline{c_2 c_1^2}\right]$$

Closed Time Average Thermal Structure (15-7)

$$\frac{\partial}{\partial t}[\overline{c_1 c_2 c_3}] + u_1 \frac{\partial}{\partial x_1}[\overline{c_1 c_2 c_3}] + u_2 \frac{\partial}{\partial x_2}[\overline{c_1 c_2 c_3}] +$$

$$u_3 \frac{\partial}{\partial x_3}[\overline{c_1 c_2 c_3}] + \overline{c_1 c_2 c_3}\frac{\partial \bar{u}_1}{\partial x_1} + \overline{c_3 c_2^2}\frac{\partial \bar{u}_1}{\partial x_2} + \overline{c_2 c_3^2}\frac{\partial \bar{u}_1}{\partial x_3} +$$

$$\overline{c_3 c_1^2}\frac{\partial \bar{u}_2}{\partial x_1} + \overline{c_1 c_2 c_3}\frac{\partial \bar{u}_2}{\partial x_2} + \overline{c_1 c_3^2}\frac{\partial \bar{u}_2}{\partial x_3} + \overline{c_2 c_1^2}\frac{\partial \bar{u}_3}{\partial x_1} + \overline{c_1 c_2^2}\frac{\partial \bar{u}_3}{\partial x_2} +$$

$$\overline{c_1 c_2 c_3}\frac{\partial \bar{u}_3}{\partial x_3} + \overline{c_1^2}\frac{\partial}{\partial x_1}[\overline{c_2 c_3}] + \overline{c_1 c_2}\frac{\partial}{\partial x_2}[\overline{c_2 c_3}] + \overline{c_1 c_3}\frac{\partial}{\partial x_3}[\overline{c_2 c_3}] +$$

$$\overline{c_1 c_2}\frac{\partial}{\partial x_1}[\overline{c_1 c_3}] + \overline{c_2^2}\frac{\partial}{\partial x_2}[\overline{c_1 c_3}] + \overline{c_2 c_3}\frac{\partial}{\partial x_3}[\overline{c_1 c_3}] +$$

$$\overline{c_1 c_3}\frac{\partial}{\partial x_1}[\overline{c_1 c_2}] + \overline{c_2 c_3}\frac{\partial}{\partial x_2}[\overline{c_1 c_2}] + \overline{c_3^2}\frac{\partial}{\partial x_3}[\overline{c_1 c_2}] = -\frac{3}{2}\bar{v}\overline{c_1 c_2 c_3}$$

Equation Set 15

Time Average Directional Turbulent Energy (15-8)

$$\frac{\partial}{\partial t}[\overline{u_1'^2}] + u_1 \frac{\partial}{\partial x_1}[\overline{u_1'^2}] + u_2 \frac{\partial}{\partial x_2}[\overline{u_1'^2}] +$$

$$u_3 \frac{\partial}{\partial x_3}[\overline{u_1'^2}] + 2\left[\overline{u_1'^2}\frac{\partial \bar{u}_1}{\partial x_1} + \overline{u_1' u_2'}\frac{\partial \bar{u}_1}{\partial x_2} + \overline{u_1' u_3'}\frac{\partial \bar{u}_1}{\partial x_3}\right] +$$

$$\frac{1}{\bar{\rho}}\left[\frac{\partial}{\partial x_1}\left[\overline{\bar{\rho} u_1' u_1'^2}\right] + \frac{\partial}{\partial x_2}\left[\overline{\bar{\rho} u_2' u_1'^2}\right] + \frac{\partial}{\partial x_3}\left[\overline{\bar{\rho} u_3' u_1'^2}\right]\right] = 0$$

Time Average Turbulent Shear (15-9)

$$\frac{\partial}{\partial t}[\overline{u_1' u_2'}] + \bar{u}_1 \frac{\partial}{\partial x_1}[\overline{u_1' u_2'}] + \bar{u}_2 \frac{\partial}{\partial x_2}[\overline{u_1' u_2'}] + \bar{u}_3 \frac{\partial}{\partial x_3}[\overline{u_1' u_2'}] +$$

$$\overline{u_1' u_2'}\frac{\partial \bar{u}_1}{\partial x_1} + \overline{u_2'^2}\frac{\partial \bar{u}_1}{\partial x_2} + \overline{u_2' u_3'}\frac{\partial \bar{u}_1}{\partial x_3} + \overline{u_1'^2}\frac{\partial \bar{u}_2}{\partial x_1} + \overline{u_1' u_2'}\frac{\partial \bar{u}_2}{\partial x_2} +$$

$$\overline{u_1' u_3'}\frac{\partial \bar{u}_2}{\partial x_3} + \frac{1}{\bar{\rho}}\left[\frac{\partial}{\partial x_1}\left[\overline{\bar{\rho} u_2' u_1'^2}\right] + \frac{\partial}{\partial x_2}\left[\overline{\bar{\rho} u_1' u_2'^2}\right] + \frac{\partial}{\partial x_3}\left[\overline{\bar{\rho} u_1' u_2' u_3'}\right]\right] = 0$$

Equation Set 15

Closed Time Average Turbulent Directional Energy Fluxes (15-10)

$$\frac{\partial}{\partial t}[\overline{u_1' u_1'^2}] + u_1 \frac{\partial}{\partial x_1}[\overline{u_1' u_1'^2}] + \bar{u}_2 \frac{\partial}{\partial x_2}[\overline{u_1' u_1'^2}] +$$

$$\bar{u}_3 \frac{\partial}{\partial x_3}[\overline{u_1' u_1'^2}] + 3[\overline{u_1' u_1'^2}]\frac{\partial \bar{u}_1}{\partial x_1} + \overline{u_2' u_1'^2}\frac{\partial \bar{u}_1}{\partial x_2} + \overline{u_3' u_1'^2}\frac{\partial \bar{u}_1}{\partial x_3} +$$

$$3\left[\overline{u_1'^2}\frac{\partial}{\partial x_1}[\overline{u_1'^2}] + \overline{u_1' u_2'}\frac{\partial}{\partial x_2}[\overline{u_1'^2}] + \overline{u_1' u_3'}\frac{\partial}{\partial x_3}[\overline{u_1'^2}]\right] +$$

$$3\overline{c_1^2}\left[\frac{\partial}{\partial x_1}[\overline{u_1'^2}] + \frac{\partial}{\partial x_2}[\overline{u_1' u_2'}] + \frac{\partial}{\partial x_3}[\overline{u_1' u_3'}]\right] +$$

$$3\left[\overline{u_1'^2}\frac{\partial}{\partial x_1}[\overline{c_1^2}] + \overline{u_1' u_2'}\frac{\partial}{\partial x_2}[\overline{c_1^2}] + \overline{u_1' u_3'}\frac{\partial}{\partial x_3}[\overline{c_1^2}]\right] = 0$$

Equation Set 15

Closed Time Average Turbulent Directional Energy Fluxes (15-11)

$$\frac{\partial}{\partial t}[\overline{u_1'u_2'^2}] + \overline{u_1}\frac{\partial}{\partial x_1}[\overline{u_1'u_2'^2}] + \overline{u_2}\frac{\partial}{\partial x_2}[\overline{u_1'u_2'^2}] + \overline{u_3}\frac{\partial}{\partial x_3}[\overline{u_1'u_2'^2}] +$$

$$2\left[\overline{u_2'u_2'^2}\frac{\partial \overline{u_2}}{\partial x_1} + \overline{u_1'u_2'^2}\frac{\partial \overline{u_2}}{\partial x_2} + \overline{u_1'u_2'u_3'}\frac{\partial \overline{u_2}}{\partial x_3}\right] + \overline{u_1'u_2'^2}\frac{\partial \overline{u_1}}{\partial x_1} + \overline{u_2'u_2'^2}\frac{\partial \overline{u_1}}{\partial x_2} +$$

$$\overline{u_3'u_1'^2}\frac{\partial \overline{u_1}}{\partial x_3} + 2\left[\overline{u_1'u_2'}\frac{\partial}{\partial x_1}[\overline{u_1'u_2'}] + \overline{u_2'^2}\frac{\partial}{\partial x_2}[\overline{u_1'u_2'}] + \overline{u_2'u_3'}\frac{\partial}{\partial x_3}[\overline{u_1'u_2'}]\right] +$$

$$\overline{u_1'^2}\frac{\partial}{\partial x_1}[\overline{u_2'^2}] + \overline{u_1'u_2'}\frac{\partial}{\partial x_2}[\overline{u_2'^2}] + \overline{u_1'u_3'}\frac{\partial}{\partial x_3}[\overline{u_2'^2}] +$$

$$2\left[\overline{u_1'u_2'}\frac{\partial}{\partial x_1}[\overline{c_1 c_2}] + \overline{u_2'^2}\frac{\partial}{\partial x_2}[\overline{c_1 c_2}] + \overline{u_2'u_3'}\frac{\partial}{\partial x_3}[\overline{c_1 c_2}]\right] +$$

$$\overline{u_1'^2}\frac{\partial}{\partial x_1}[\overline{c_2^2}] + \overline{u_1'u_2'}\frac{\partial}{\partial x_2}[\overline{c_2^2}] + \overline{u_1'u_3'}\frac{\partial}{\partial x_3}[\overline{c_2^2}] +$$

$$2\left[\overline{c_1 c_2}\frac{\partial}{\partial x_1}[\overline{u_1'u_2'}] + \overline{c_2^2}\frac{\partial}{\partial x_2}[\overline{u_1'u_2'}] + \overline{c_2 c_3}\frac{\partial}{\partial x_3}[\overline{u_1'u_2'}]\right] +$$

$$\overline{c_1^2}\frac{\partial}{\partial x_1}[\overline{u_2'^2}] + \overline{c_1 c_2}\frac{\partial}{\partial x_2}[\overline{u_2'^2}] + \overline{c_1 c_3}\frac{\partial}{\partial x_2}[\overline{u_2'^2}] = 0$$

Equation Set 15

Closed Time Average Turbulent Structure (15-12)

$$\frac{\partial}{\partial t}[\overline{u_1'u_2'u_3'}] + \overline{u_1}\frac{\partial}{\partial x_1}[\overline{u_1'u_2'u_3'}] + \overline{u_2}\frac{\partial}{\partial x_2}[\overline{u_1'u_2'u_3'}] + \overline{u_3}\frac{\partial}{\partial x_3}[\overline{u_1'u_2'u_3'}] +$$

$$\overline{u_1'u_2'u_3'}\frac{\partial \overline{u_1}}{\partial x_1} + \overline{u_3'u_2'^2}\frac{\partial \overline{u_1}}{\partial x_2} + \overline{u_2'u_3'^2}\frac{\partial \overline{u_1}}{\partial x_3} + \overline{u_3'u_1'^2}\frac{\partial \overline{u_2}}{\partial x_1} + \overline{u_1'u_2'u_3'}\frac{\partial \overline{u_2}}{\partial x_2} +$$

$$\overline{u_1'u_3'^2}\frac{\partial \overline{u_2}}{\partial x_3} + \overline{u_2'u_1'^2}\frac{\partial \overline{u_3}}{\partial x_1} + \overline{u_1'u_2'^2}\frac{\partial \overline{u_3}}{\partial x_2} + \overline{u_1'u_2'u_3'}\frac{\partial \overline{u_3}}{\partial x_3} + \overline{u_1'u_3'}\frac{\partial}{\partial x_1}[\overline{u_1'u_2'}] +$$

$$\overline{u_2'u_3'}\frac{\partial}{\partial x_2}[\overline{u_1'u_2'}] + \overline{u_3'^2}\frac{\partial}{\partial x_3}[\overline{u_1'u_2'}] + [\overline{u_1'u_2'}]\frac{\partial}{\partial x_1}[\overline{u_1'u_3'}] + \overline{u_2'^2}\frac{\partial}{\partial x_2}[\overline{u_1'u_3'}] +$$

$$\overline{u_2'u_3'}\frac{\partial}{\partial x_3}[\overline{u_1'u_3'}] + \overline{u_1'^2}\frac{\partial}{\partial x_1}[\overline{u_2'u_3'}] + \overline{u_1'u_2'}\frac{\partial}{\partial x_2}[\overline{u_2'u_3'}] + \overline{u_1'u_3'}\frac{\partial}{\partial x_3}[\overline{u_2'u_3'}] +$$

$$\overline{c_1 c_3}\frac{\partial}{\partial x_1}[\overline{u_1'u_2'}] + \overline{c_2 c_3}\frac{\partial}{\partial x_2}[\overline{u_1'u_2'}] + \overline{c_3^2}\frac{\partial}{\partial x_3}[\overline{u_1'u_2'}] + \overline{c_1 c_2}\frac{\partial}{\partial x_1}[\overline{u_1'u_3'}] +$$

$$\overline{c_2^2}\frac{\partial}{\partial x_2}[\overline{u_1'u_3'}] + \overline{c_2 c_3}\frac{\partial}{\partial x_3}[\overline{u_1'u_3'}] + \overline{c_1^2}\frac{\partial}{\partial x_1}[\overline{u_2'u_3'}] + \overline{c_1 c_2}\frac{\partial}{\partial x_2}[\overline{u_2'u_3'}] +$$

$$\overline{c_1 c_3}\frac{\partial}{\partial x_3}[\overline{u_2'u_3'}] + \overline{u_1'u_3'}\frac{\partial}{\partial x_1}[\overline{c_1 c_2}] + \overline{u_2'u_3'}\frac{\partial}{\partial x_2}[\overline{c_1 c_2}] +$$

$$\overline{u_3'^2}\frac{\partial}{\partial x_3}[\overline{c_1 c_2}] + \overline{u_1'u_2'}\frac{\partial}{\partial x_1}[\overline{c_1 c_3}] + \overline{u_2'^2}\frac{\partial}{\partial x_2}[\overline{c_1 c_3}] + \overline{u_2'u_3'}\frac{\partial}{\partial x_3}[\overline{c_1 c_3}] +$$

$$\overline{u_1'^2}\frac{\partial}{\partial x_1}[\overline{c_2 c_3}] + \overline{u_1'u_2'}\frac{\partial}{\partial x_2}[\overline{c_2 c_3}] + \overline{u_1'u_3'}\frac{\partial}{\partial x_3}[\overline{c_2 c_3}] = 0$$

Equation Set 16

(16-1; 16-2; 16-3)

$$\overline{c_1^{l+1} c_2^m c_3^n} = l[\overline{c_1^2}]\overline{c_1^{l-1} c_2^m c_3^n} + m[\overline{c_1 c_2}]\overline{c_1^l c_2^{m-1} c_3^n} + n[\overline{c_1 c_3}]\overline{c_1^l c_2^m c_3^{n-1}}$$

$$\overline{c_1^l c_2^{m+1} c_3^n} = l[\overline{c_1 c_2}]\overline{c_1^{l-1} c_2^m c_3^n} + m[\overline{c_2^2}]\overline{c_1^l c_2^{m-1} c_3^n} + n[\overline{c_2 c_3}]\overline{c_1^l c_2^m c_3^{n-1}}$$

-continued $$\overline{c_1^l c_2^m c_3^{n+1}} = l[\overline{c_1 c_3}]\overline{c_1^{l-1} c_2^m c_3^n} + m[\overline{c_2 c_3}]\overline{c_1^l c_2^{m-1} c_3^n} + n[\overline{c_3^2}]\overline{c_1^l c_2^m c_3^{n-1}}$$

neglected terms being of Burnett order.

Equation Set 17

(17-1; 17-2; 17-3)

$$\overline{u_1'^{l+1} u_2'^m u_3'^n} = l[\overline{u_1'^2}]\overline{u_1'^{l-1} u_2'^m u_3'^n} + m[\overline{u_1'u_2'}]\overline{u_1'^l u_2'^{m-1} u_3'^n} + n[\overline{u_1'u_3'}]\overline{u_1'^l u_2'^m u_3'^{n-1}}$$

$$\overline{u_1'^l u_2'^{m+1} u_3'^n} = l[\overline{u_1'u_2'}]\overline{u_1'^{l-1} u_2'^m u_3'^n} + m[\overline{u_2'^2}]\overline{u_1'^l u_2'^{m-1} u_3'^n} + n[\overline{u_2'u_3'}]\overline{u_1'^l u_2'^m u_3'^{n-1}}$$

$$\overline{u_1'^l u_2'^m u_3'^{n+1}} = l[\overline{u_1'u_3'}]\overline{u_1'^{l-1} u_2'^m u_3'^n} + m[\overline{u_2'u_3'}]\overline{u_1'^l u_2'^{m-1} u_3'^n} + n[\overline{u_3'^2}]\overline{u_1'^l u_2'^m u_3'^{n-1}}$$

neglected terms being of Burnett order.

Equation 18

(18-1; 18-2; 18-3)

$$t, 80 \ \overline{c_1^{l+1} c_2^m c_3^n}^* = l\left[\frac{\overline{c^2}}{3}\right]\overline{c_1^{l-1} c_2^m c_3^n}, \quad l \text{ odd}, m \text{ and } n \text{ even}$$

$$= 0 \quad l, m \text{ and } n \text{ all odd}$$

$$\overline{c_1^l c_2^{m+1} c_3^n}^* = m\left[\frac{\overline{c^2}}{3}\right]\overline{c_1^l c_2^{m-1} c_3^n}, \quad m \text{ odd}, l \text{ and } n \text{ even}$$

$$= 0 \quad l, m \text{ and } n \text{ all odd}$$

$$\overline{c_1^l c_2^m c_3^{n+1}}^* = n\left[\frac{\overline{c^2}}{3}\right]\overline{c_1^l c_2^m c_3^{n-1}}, \quad n \text{ odd}, l \text{ and } m \text{ even}$$

$$= 0 \quad l, m \text{ and } n \text{ all odd}$$

neglected terms being of Burnett order, where l+m+n=2N+1, an odd number.

What is claimed is:

1. A method of analyzing and computing anisotropic turbulent flow quantities of an anisotropic fluid comprising:
   providing input to a general purpose computer defining, for an anisotropic fluid, a set of moment equations governing time average thermal and turbulent motion, directional kinetic energy, shear, directional kinetic energy fluxes, and structure correlations;
   instructing the general purpose computer to calculate $n^{th}$ order, wherein n is odd, directional kinetic energy fluxes and structure correlation equations using $(n+1)^{th}$ order density gradient independent time average thermal and turbulent moment closure relationships to yield a set of closed time average turbulent moment equations;
   using the set of closed time average turbulent moment equations to calculate a turbulent flow quantity of the anisotropic fluid; and
   displaying the calculated turbulent flow quantity;
   wherein the set of moment equations governing time average turbulent directional kinetic energy, shear, directional kinetic energy fluxes, and structure correlations is defined by:

Directional Kinetic Energy $$\frac{\partial}{\partial t}[\overline{u_1'^2}] + \overline{u_1}\frac{\partial}{\partial x_1}[\overline{u_1'^2}] + \overline{u_2}\frac{\partial}{\partial x_2}[\overline{u_1'^2}] +$$

$$\overline{u_3}\frac{\partial}{\partial x_3}[\overline{u_1'^2}] + 2\left[\overline{u_1'^2}\frac{\partial \overline{u_1}}{\partial x_1} + \overline{u_1'u_2'}\frac{\partial \overline{u_1}}{\partial x_2} + \overline{u_1'u_3'}\frac{\partial \overline{u_1}}{\partial x_3}\right] +$$

$$\frac{1}{\overline{\rho}}\left[\frac{\partial}{\partial x_1}[\overline{\rho u_1'u_1'^2}] + \frac{\partial}{\partial x_2}[\overline{\rho u_2'u_1'^2}] + \frac{\partial}{\partial x_3}[\overline{\rho u_3'u_1'^2}]\right] = 0$$

Shear $$\frac{\partial}{\partial t}[\overline{u_1'u_2'}] + \overline{u_1}\frac{\partial}{\partial x_1}[\overline{u_1'u_2'}] + \overline{u_2}\frac{\partial}{\partial x_2}[\overline{u_1'u_2'}] + \overline{u_3}\frac{\partial}{\partial x_3}[\overline{u_1'u_2'}] +$$

$$\overline{u_1'u_2'}\frac{\partial \overline{u_1}}{\partial x_1} + \overline{u_2'^2}\frac{\partial \overline{u_1}}{\partial x_2} + \overline{u_2'u_3'}\frac{\partial \overline{u_1}}{\partial x_3} + \overline{u_1'^2}\frac{\partial \overline{u_2}}{\partial x_1} + \overline{u_1'u_2'}\frac{\partial \overline{u_2}}{\partial x_2} +$$

$$\overline{u_1'u_3'}\frac{\partial \overline{u_2}}{\partial x_3} + \frac{1}{\overline{\rho}}\left[\frac{\partial}{\partial x_1}[\overline{\rho u_2'u_1'^2}] + \frac{\partial}{\partial x_2}[\overline{\rho u_1'u_2'^2}] + \frac{\partial}{\partial x_3}[\overline{\rho u_1'u_2'u_3'}]\right] = 0$$

Directional Kinetic Energy Fluxes $$\frac{\partial}{\partial t}[\overline{u_1'u_1'^2}] + \overline{u_1}\frac{\partial}{\partial x_1}[\overline{u_1'u_1'^2}] \overline{u_2}\frac{\partial}{\partial x_2}[\overline{u_1'u_1'^2}] +$$

$$\overline{u_3}\frac{\partial}{\partial x_3}[\overline{u_1'u_1'^2}] + 3\left[\overline{u_1'u_1'^2}\frac{\partial \overline{u_1}}{\partial x_1} + \overline{u_2'u_1'^2}\frac{\partial \overline{u_1}}{\partial x_2} + \overline{u_3'u_1'^2}\frac{\partial \overline{u_1}}{\partial x_3}\right] -$$

$$3\overline{u_1'^2}\left[\frac{\partial}{\partial x_1}[\overline{u_1'^2}] + \frac{\partial}{\partial x_2}[\overline{u_1'u_2'}] + \frac{\partial}{\partial x_3}[\overline{u_1'u_3'}]\right] +$$

$$3\overline{c_1^2}\left[\frac{\delta}{\delta x_1}[\overline{u_1'^2}] + \frac{\partial}{\partial x_2}[\overline{u_1'u_2'}] + \frac{\partial}{\partial x_3}[\overline{u_1'u_3'}]\right] +$$

$$3\left[\overline{u_1'^2}\frac{\partial}{\partial x_1}[\overline{c_1^2}] + \overline{u_1'u_2'}\frac{\partial}{\partial x_2}[\overline{c_1^2}] + \overline{u_1'u_3'}\frac{\partial}{\partial x_3}[\overline{c_1^2}]\right] + \frac{\partial}{\partial x_1}[\overline{u_1'^2 u_1'^2}] +$$

$$\frac{\partial}{\partial x_2}[\overline{u_1'u_2'u_1'^2}] + \frac{\partial}{\partial x_3}[\overline{u_1'u_3'u_1'^2}] + [\overline{u_1'^2 u_1'^2} - 3\overline{u_1'^2}[\overline{u_1'^2}]]\frac{1}{\overline{\rho}}\frac{\partial \overline{\rho}}{\partial x_1} + [\overline{u_1'u_2'u_1'^2} -$$

$$3\overline{u_1'u_2'}[\overline{u_1'^2}]]\frac{1}{\overline{\rho}}\frac{\partial \overline{\rho}}{\partial x_2} + [\overline{u_1'u_3'u_1'^2} - 3\overline{u_1'u_3'}[\overline{u_1'^2}]]\frac{1}{\overline{\rho}}\frac{\partial \overline{\rho}}{\partial x_3} = 0$$

and $$\frac{\partial}{\partial t}[\overline{u_1'u_2'^2}] + \overline{u_2}\frac{\partial}{\partial x_2}[\overline{u_1'u_2'^2}] + \overline{u_1}\frac{\partial}{\partial x_1}[\overline{u_1'u_2'^2}] + \overline{u_3}\frac{\partial}{\partial x_3}[\overline{u_1'u_2'^2}] +$$

$$2\left[\overline{u_1'u_2'^2}\frac{\partial \overline{u_2}}{\partial x_2} + \overline{u_2'u_1'^2}\frac{\partial \overline{u_2}}{\partial x_1} + \overline{u_1'u_2'u_3'}\frac{\partial \overline{u_2}}{\partial x_3}\right] + \overline{u_2'^2 u_2'}\frac{\partial \overline{u_1}}{\partial x_2} + \overline{u_1'u_2'^2}\frac{\partial \overline{u_1}}{\partial x_1} +$$

$$\overline{u_3'u_2'^2}\frac{\partial \overline{u_1}}{\partial x_3} - 2\overline{u_1'u_2'}\left[\frac{\partial}{\partial x_1}[\overline{u_2'^2}] + \frac{\partial}{\partial x_1}[\overline{u_1'u_2'}] + \frac{\partial}{\partial x_3}[\overline{u_2'u_3'}]\right] -$$

$$\overline{u_2'^2}\left[\frac{\partial}{\partial x_2}[\overline{u_1'u_2'}] + \frac{\partial}{\partial x_1}[\overline{u_1'^2}] + \frac{\partial}{\partial x_3}[\overline{u_1'u_3'}]\right] +$$

$$2\left[\overline{c_2^2}\frac{\partial}{\partial x_1}[\overline{u_1'u_2'}] + \overline{c_1 c_2}\frac{\partial}{\partial x_1}[\overline{u_1'u_2'}] + \overline{c_2 c_3}\frac{\partial}{\partial x_3}[\overline{u_1'u_2'}]\right] +$$

$$\overline{c_1 c_2}\frac{\partial}{\partial x_2}[\overline{u_2'^2}] + \overline{c_1^2}\frac{\partial}{\partial x_1}[\overline{u_2'^2}] + \overline{c_1 c_3}\frac{\partial}{\partial x_3}[\overline{u_2'^2}] +$$

$$2\left[\overline{u_2'^2}\frac{\partial}{\partial x_2}[\overline{u_1'u_2'}] + \overline{u_1'u_2'}\frac{\partial}{\partial x_1}[\overline{u_1'u_2'}] + \overline{u_2'u_3'}\frac{\partial}{\partial x_3}[\overline{u_1'u_2'}]\right] + \overline{u_1'u_2'}\frac{\partial}{\partial x_2}[\overline{c_2^2}] +$$

$$\overline{u_1'^2}\frac{\partial}{\partial x_1}[\overline{c_2^2}] + \overline{u_1'u_3'}\frac{\partial}{\partial x_3}[\overline{c_1^2}] + \frac{\partial}{\partial x_2}[\overline{u_1'u_2'u_2'^2}] + \frac{\partial}{\partial x_1}[\overline{u_1'^2 u_2'^2}] +$$

$$\frac{\partial}{\partial x_3}[\overline{u_1'u_3'u_2'^2}] + [\overline{u_1'u_2'u_2'^2} - 3\overline{u_1'u_2'}[\overline{u_2'^2}]]\frac{1}{\overline{\rho}}\frac{\partial \overline{\rho}}{\partial x_2} + [\overline{u_1'^2 u_2'^2} - \overline{u_1'^2}[\overline{u_2'^2}] -$$

-continued $$2\overline{u_1'u_2'}[\overline{u_1'u_2'}]]\frac{1}{\overline{\rho}}\frac{\partial \overline{\rho}}{\partial x_1} + [\overline{u_1'u_3'u_2'^2} - \overline{u_1'u_3'}[\overline{u_2'^2}] - 2\overline{u_2'u_3'}[\overline{u_1'u_2'}]]\frac{1}{\overline{\rho}}\frac{\partial \overline{\rho}}{\partial x_3} = 0$$

Structure Correlations $$\frac{\partial}{\partial t}[\overline{u_1'u_2'u_3'}] + \overline{u_1}\frac{\partial}{\partial x_1}[\overline{u_1'u_2'u_3'}] + \overline{u_2}\frac{\partial}{\partial x_2}[\overline{u_1'u_2'u_3'}] +$$

$$\overline{u_3}\frac{\partial}{\partial x_3}[\overline{u_1'u_2'u_3'}] + \overline{u_1'u_2'u_3'}\frac{\partial \overline{u_1}}{\partial x_1} + \overline{u_2'u_3'^2}\frac{\partial \overline{u_2}}{\partial x_2} + \overline{u_2'u_3'^2}\frac{\partial \overline{u_1}}{\partial x_3} +$$

$$\overline{u_3'u_1'^2}\frac{\partial \overline{u_2}}{\partial x_1} + \overline{u_1'u_2'u_3'}\frac{\partial \overline{u_2}}{\partial x_2} + \overline{u_1'u_3'^2}\frac{\partial \overline{u_2}}{\partial x_3} + \overline{u_2'u_1'^2}\frac{\partial \overline{u_3}}{\partial x_1} + \overline{u_1'u_2'^2}\frac{\partial \overline{u_3}}{\partial x_2} +$$

$$\overline{u_1'u_2'u_3'}\frac{\partial \overline{u_3}}{\partial x_3} - \overline{u_1'u_2'}\left[\frac{\partial}{\partial x_1}[\overline{u_1'u_3'}] + \frac{\partial}{\partial x_2}[\overline{u_2'u_3'}] + \frac{\partial}{\partial x_3}[\overline{u_3'^2}]\right] -$$

$$\overline{u_1'u_3'}\left[\frac{\partial}{\partial x_1}[\overline{u_1'u_2'}] + \frac{\partial}{\partial x_2}[\overline{u_2'^2}] + \frac{\partial}{\partial x_3}[\overline{u_2'u_3'}]\right] -$$

$$\overline{u_2'u_3'}\left[\frac{\partial}{\partial x_1}[\overline{u_1'^2}] + \frac{\partial}{\partial x_2}[\overline{u_1'u_2'}] + \frac{\partial}{\partial x_3}[\overline{u_1'u_3'}]\right] + \overline{u_1'^2}\frac{\partial}{\partial x_1}[\overline{c_2 c_3}] +$$

$$\overline{u_1'u_2'}\frac{\partial}{\partial x_2}[\overline{c_2 c_3}] + \overline{u_1'u_3'}\frac{\partial}{\partial x_3}[\overline{c_2 c_3}] + \overline{u_1'u_2'}\frac{\partial}{\partial x_1}[\overline{c_1 c_3}] +$$

$$\overline{u_2'^2}\frac{\partial}{\partial x_2}[\overline{c_1 c_3}] + \overline{u_2'u_3'}\frac{\partial}{\partial x_3}[\overline{c_1 c_3}] + \overline{u_1'u_3'}\frac{\partial}{\partial x_1}[\overline{c_1 c_2}] +$$

$$\overline{u_2'u_3'}\frac{\partial}{\partial x_2}[\overline{c_1 c_2}] + \overline{u_3'^2}d\frac{\partial}{\partial x_3}[\overline{c_1 c_2}] + \overline{c_1^2}\frac{\partial}{\partial x_1}[\overline{u_2'u_3'}] + \overline{c_1 c_2}\frac{\partial}{\partial x_2}[\overline{u_2'u_3'}] +$$

$$\overline{c_1 c_3}\frac{\partial}{\partial x_3}[\overline{u_2'u_3'}] + \overline{c_1 c_3}\frac{\partial}{\partial x_1}[\overline{u_1'u_2'}] + \overline{c_2 c_3}\frac{\partial}{\partial x_2}[\overline{u_1'u_2'}] + \overline{c_3^2}\frac{\partial}{\partial x_3}[\overline{u_1'u_2'}] +$$

$$\overline{c_1 c_2}\frac{\partial}{\partial x_1}[\overline{u_1'u_3'}] + \overline{c_2^2}\frac{\partial}{\partial x_2}[\overline{u_1'u_3'}] + \overline{c_2 c_3}\frac{\partial}{\partial x_3}[\overline{u_1'u_3'}] + \frac{\partial}{\partial x_1}[\overline{u_2'u_3'u_1'^2}] +$$

$$\frac{\partial}{\partial x_2}[\overline{u_1'u_3'u_2'^2}] + \frac{\partial}{\partial x_3}[\overline{u_1'u_2'u_3'^2}] + [\overline{u_2'u_3'u_1'^2} - \overline{u_2'u_3'}[\overline{u_1'^2}] -$$

$$2\overline{u_1'u_2'}[\overline{u_1'u_3'}]]\frac{1}{\overline{\rho}}\frac{\partial \overline{\rho}}{\partial x_1} + [\overline{u_1'u_3'u_2'^2} - \overline{u_1'u_3'}[\overline{u_2'^2}] - 2\overline{u_1'u_2'}[\overline{u_2'u_3'}]]\frac{1}{\overline{\rho}}\frac{\partial \overline{\rho}}{\partial x_2} +$$

$$[\overline{u_1'u_2'u_3'^2} - \overline{u_1'u_2'}[\overline{u_3'^2}] - 2\overline{u_1'u_3'}[\overline{u_2'u_3'}]]\frac{1}{\overline{\rho}}\frac{\partial \overline{\rho}}{\partial x_3} = 0.$$

2. A computer readable storage medium containing a set of instructions for a general purpose computer, the set of instructions defining a method of deriving a set of closed time average turbulent moment equations for analyzing and computing anisotropic turbulent flow quantities of an anisotropic fluid comprising:

defining, for an anisotropic fluid, a set of moment equations governing time average thermal and turbulent motion, directional kinetic energy, shear, directional kinetic energy fluxes, and structure correlations;

calculating $n^{th}$ order, wherein n is odd, directional kinetic energy fluxes and structure correlation equations using $(n+1)^{th}$ order density gradient independent time average thermal and turbulent moment closure relationships to yield a set of closed time average turbulent moment equations;

using the set of closed time average turbulent moment equations to calculate a turbulent flow quantity of the anisotropic fluid; and displaying the calculated turbulent flow quantity;

wherein the set of moment equations governing time average turbulent directional kinetic energy, shear, directional kinetic energy fluxes, and structure correlations is defined by:

Directional Kinetic Energy $$\frac{\partial}{\partial t}[\overline{u_1'^2}] + \overline{u_1}\frac{\partial}{\partial x_1}[\overline{u_1'^2}] + \overline{u_2}\frac{\partial}{\partial x_2}[\overline{u_1'^2}] + \overline{u_3}\frac{\partial}{\partial x_3}[\overline{u_1'^2}] + 2\left[\overline{u_1'^2}\frac{\partial \overline{u_1}}{\partial x_1} + \overline{u_1'u_2'}\frac{\partial \overline{u_1}}{\partial x_2} + \overline{u_1'u_3'}\frac{\partial \overline{u_1}}{\partial x_3}\right] + \frac{1}{\overline{\rho}}\left[\frac{\partial}{\partial x_1}[\overline{\rho u_1'u_1'^2}] + \frac{\partial}{\partial x_2}[\overline{\rho u_2'u_1'^2}] + \frac{\partial}{\partial x_3}[\overline{\rho u_3'u_1'^2}]\right] = 0$$

Shear $$\frac{\partial}{\partial t}[\overline{u_1'u_2'}] + \overline{u_1}\frac{\partial}{\partial x_1}[\overline{u_1'u_2'}] + \overline{u_2}\frac{\partial}{\partial x_2}[\overline{u_1'u_2'}] + \overline{u_3}\frac{\partial}{\partial x_3}[\overline{u_1'u_2'}] + \overline{u_1'u_2'}\frac{\partial \overline{u_1}}{\partial x_1} + \overline{u_2'^2}\frac{\partial \overline{u_1}}{\partial x_2} + \overline{u_2'u_3'}\frac{\partial \overline{u_1}}{\partial x_3} + \overline{u_1'^2}\frac{\partial \overline{u_2}}{\partial x_1} + \overline{u_1'u_2'}\frac{\partial \overline{u_2}}{\partial x_2} + \overline{u_1'u_3'}\frac{\partial \overline{u_2}}{\partial x_3} + \frac{1}{\overline{\rho}}\left[\frac{\partial}{\partial x_1}[\overline{\rho u_2'u_1'^2}] + \frac{\partial}{\partial x_2}[\overline{\rho u_1'u_2'^2}] + \frac{\partial}{\partial x_3}[\overline{\rho u_1'u_2'u_3'}]\right] = 0$$

Directional Kinetic Energy Fluxes $$\frac{\partial}{\partial t}[\overline{u_1'u_1'^2}] + \overline{u_1}\frac{\partial}{\partial x_1}[\overline{u_1'u_1'^2}] + \overline{u_2}\frac{\partial}{\partial x_2}[\overline{u_1'u_1'^2}] + \overline{u_3}\frac{\partial}{\partial x_3}[\overline{u_1'u_1'^2}] + 3\left[\overline{u_1'u_1'^2}\frac{\partial \overline{u_1}}{\partial x_1} + \overline{u_2'u_1'^2}\frac{\partial \overline{u_1}}{\partial x_2} + \overline{u_3'u_1'^2}\frac{\partial \overline{u_1}}{\partial x_3}\right] - 3\overline{u_1'^2}\left[\frac{\partial}{\partial x_1}[\overline{u_1'^2}] + \frac{\partial}{\partial x_2}[\overline{u_1'u_2'}] + \frac{\partial}{\partial x_3}[\overline{u_1'u_3'}]\right] + 3\overline{c_1'^2}\left[\frac{\delta}{\delta x_1}[\overline{u_1'^2}] + \frac{\partial}{\partial x_2}[\overline{u_1'u_2'}] + \frac{\partial}{\partial x_3}[\overline{u_1'u_3'}]\right] + 3\left[\overline{u_1'^2}\frac{\partial}{\partial x_1}[\overline{c_1'^2}] + \overline{u_1'u_2'}\frac{\partial}{\partial x_2}[\overline{c_1'^2}] + \overline{u_1'u_3'}\frac{\partial}{\partial x_3}[\overline{c_1'^2}]\right] + \frac{\partial}{\partial x_1}[\overline{u_1'^2 u_1'^2}] + \frac{\partial}{\partial x_2}[\overline{u_1'u_2'u_1'^2}] + \frac{\partial}{\partial x_3}[\overline{u_1'u_3'u_1'^2}] + \left[\overline{u_1'^2 u_1'^2} - 3\overline{u_1'^2}[\overline{u_1'^2}]\right]\frac{1}{\overline{\rho}}\frac{\partial \overline{p}}{\partial x_1} + \left[\overline{u_1'u_2'u_1'^2} - 3\overline{u_1'u_2'}[\overline{u_1'^2}]\right]\frac{1}{\overline{\rho}}\frac{\partial \overline{p}}{\partial x_2} + \left[\overline{u_1'u_3'u_1'^2} - 3\overline{u_1'u_3'}[\overline{u_1'^2}]\right]\frac{1}{\overline{\rho}}\frac{\partial \overline{p}}{\partial x_3} = 0$$

and $$\frac{\partial}{\partial t}[\overline{u_1'u_2'^2}] + \overline{u_2}\frac{\partial}{\partial x_2}[\overline{u_1'u_2'^2}] + \overline{u_1}\frac{\partial}{\partial x_1}[\overline{u_1'u_2'^2}] + \overline{u_3}\frac{\partial}{\partial x_3}[\overline{u_1'u_2'^2}] + 2\left[\overline{u_1'u_2'^2}\frac{\partial \overline{u_2}}{\partial x_2} + \overline{u_2'u_1'^2}\frac{\partial \overline{u_2}}{\partial x_1} + \overline{u_1'u_2'u_3'}\frac{\partial \overline{u_2}}{\partial x_3}\right] + \overline{u_2'u_2'^2}\frac{\partial \overline{u_1}}{\partial x_2} + \overline{u_1'u_2'}\frac{\partial \overline{u_1}}{\partial x_1} + \overline{u_3'u_1'^2}\frac{\partial \overline{u_1}}{\partial x_3} - 2\overline{u_1'u_2'}\left[\frac{\partial}{\partial x_1}[\overline{u_2'^2}] + \frac{\partial}{\partial x_2}[\overline{u_1'u_2'}] + \frac{\partial}{\partial x_3}[\overline{u_2'u_3'}]\right] - \overline{u_2'^2}\left[\frac{\partial}{\partial x_2}[\overline{u_1'u_2'}] + \frac{\partial}{\partial x_1}[\overline{u_2'^2}] + \frac{\partial}{\partial x_3}[\overline{u_1'u_3'}]\right] + 2\left[\overline{c_2'^2}\frac{\partial}{\partial x_1}[\overline{u_1'u_2'}] + \overline{c_1c_2}\frac{\partial}{\partial x_1}[\overline{u_1'u_2'}] + \overline{c_2c_3}\frac{\partial}{\partial x_3}[\overline{u_1'u_2'}]\right] +$$

-continued $$\overline{c_1c_2}\frac{\partial}{\partial x_2}[\overline{u_2'^2}] + \overline{c_1'^2}\frac{\partial}{\partial x_1}[\overline{u_2'^2}] + \overline{c_1c_3}\frac{\partial}{\partial x_3}[\overline{u_2'^2}] + 2\left[\overline{u_2'^2}\frac{\partial}{\partial x_2}[\overline{u_1'u_2'}] + \overline{u_1'u_2'}\frac{\partial}{\partial x_1}[\overline{u_1'u_2'}] + \overline{u_2'u_3'}\frac{\partial}{\partial x_3}[\overline{u_1'u_2'}]\right] + \overline{u_1'u_2'}\frac{\partial}{\partial x_2}[\overline{c_2'^2}] + \overline{u_1'^2}\frac{\partial}{\partial x_1}[\overline{c_2'^2}] + \overline{u_1'u_3'}\frac{\partial}{\partial x_3}[\overline{c_1'^2}] + \frac{\partial}{\partial x_2}[\overline{u_1'u_2'u_2'^2}] + \frac{\partial}{\partial x_1}[\overline{u_1'^2 u_2'^2}] + \frac{\partial}{\partial x_3}[\overline{u_1'u_3'u_2'^2}] + \left[\overline{u_1'u_2'u_2'^2} - 3\overline{u_1'u_2'}[\overline{u_2'^2}]\right]\frac{1}{\overline{\rho}}\frac{\partial \overline{p}}{\partial x_2} + \left[\overline{u_1'^2 u_2'^2} - \overline{u_1'^2}[\overline{u_2'^2}] - 2\overline{u_1'u_2'}[\overline{u_1'u_2'}]\right]\frac{1}{\overline{\rho}}\frac{\partial \overline{p}}{\partial x_1} + \left[\overline{u_1'u_3'u_2'^2} - \overline{u_1'u_3'}[\overline{u_2'^2}] - 2\overline{u_1'u_2'}[\overline{u_2'u_3'}]\right]\frac{1}{\overline{\rho}}\frac{\partial \overline{p}}{\partial x_3} = 0$$

Structure Correlations $$\frac{\partial}{\partial t}[\overline{u_1'u_2'u_3'}] + \overline{u_1}\frac{\partial}{\partial x_1}[\overline{u_1'u_2'u_3'}] + \overline{u_2}\frac{\partial}{\partial x_2}[\overline{u_1'u_2'u_3'}] + \overline{u_3}\frac{\partial}{\partial x_3}[\overline{u_1'u_2'u_3'}] + \overline{u_1'u_2'u_3'}\frac{\partial \overline{u_1}}{\partial x_1} + \overline{u_3'u_2'^2}\frac{\partial \overline{u_2}}{\partial x_2} + \overline{u_2'u_3'^2}\frac{\partial \overline{u_1}}{\partial x_3} + \overline{u_3'u_1'^2}\frac{\partial \overline{u_2}}{\partial x_1} + \overline{u_1'u_2'u_3'}\frac{\partial \overline{u_2}}{\partial x_2} + \overline{u_1'u_3'^2}\frac{\partial \overline{u_2}}{\partial x_3} + \overline{u_2'u_3'^2}\frac{\partial \overline{u_3}}{\partial x_1} + \overline{u_1'u_2'^2}\frac{\partial \overline{u_3}}{\partial x_2} + \overline{u_1'u_2'u_3'}\frac{\partial \overline{u_3}}{\partial x_3} - \overline{u_1'u_2'}\left[\frac{\partial}{\partial x_1}[\overline{u_1'u_3'}] + \frac{\partial}{\partial x_2}[\overline{u_2'u_3'}] + \frac{\partial}{\partial x_3}[\overline{u_3'^2}]\right] - \overline{u_1'u_3'}\left[\frac{\partial}{\partial x_1}[\overline{u_1'u_2'}] + \frac{\partial}{\partial x_2}[\overline{u_2'^2}] + \frac{\partial}{\partial x_3}[\overline{u_2'u_3'}]\right] - \overline{u_2'u_3'}\left[\frac{\partial}{\partial x_1}[\overline{u_1'^2}] + \frac{\partial}{\partial x_2}[\overline{u_1'u_2'}] + \frac{\partial}{\partial x_3}[\overline{u_1'u_3'}]\right] + \overline{u_1'^2}\frac{\partial}{\partial x_1}[\overline{c_2c_3}] + \overline{u_1'u_2'}\frac{\partial}{\partial x_2}[\overline{c_2c_3}] + \overline{u_1'u_3'}\frac{\partial}{\partial x_3}[\overline{c_2c_3}] + \overline{u_1'u_2'}\frac{\partial}{\partial x_1}[\overline{c_1c_3}] + \overline{u_2'^2}\frac{\partial}{\partial x_2}[\overline{c_1c_3}] + \overline{u_2'u_3'}\frac{\partial}{\partial x_3}[\overline{c_1c_3}] + \overline{u_1'u_3'}\frac{\partial}{\partial x_1}[\overline{c_1c_2}] + \overline{u_2'u_3'}\frac{\partial}{\partial x_2}[\overline{c_1c_2}] + \overline{u_3'^2}\frac{\partial}{\partial x_3}[\overline{c_1c_2}] + \overline{c_1'^2}\frac{\partial}{\partial x_1}[\overline{u_2'u_3'}] + \overline{c_1c_2}\frac{\partial}{\partial x_2}[\overline{u_2'u_3'}] + \overline{c_1c_3}\frac{\partial}{\partial x_3}[\overline{u_2'u_3'}] + \overline{c_2'^2}\frac{\partial}{\partial x_2}[\overline{u_1'u_3'}] + \overline{c_1c_2}\frac{\partial}{\partial x_1}[\overline{u_1'u_3'}] + \overline{c_2c_3}\frac{\partial}{\partial x_3}[\overline{u_1'u_3'}] + \overline{c_2c_3}\frac{\partial}{\partial x_3}[\overline{u_1'u_3'}] + \frac{\partial}{\partial x_1}[\overline{u_2'u_3'u_1'^2}] + \frac{\partial}{\partial x_2}[\overline{u_1'u_3'u_2'^2}] + \frac{\partial}{\partial x_3}[\overline{u_1'u_2'u_3'^2}] + \left[\overline{u_2'u_3'u_1'^2} - \overline{u_2'u_3'}[\overline{u_1'^2}] - 2\overline{u_1'u_2'}[\overline{u_1'u_3'}]\right]\frac{1}{\overline{\rho}}\frac{\partial \overline{p}}{\partial x_1} + \left[\overline{u_1'u_3'u_2'^2} - \overline{u_1'u_3'}[\overline{u_2'^2}] - 2\overline{u_1'u_2'}[\overline{u_2'u_3'}]\right]\frac{1}{\overline{\rho}}\frac{\partial \overline{p}}{\partial x_2} + \left[\overline{u_1'u_2'u_3'^2} - \overline{u_1'u_2'}[\overline{u_3'^2}] - 2\overline{u_1'u_3'}[\overline{u_2'u_3'}]\right]\frac{1}{\overline{\rho}}\frac{\partial \overline{p}}{\partial x_3} = 0.$$

* * * * *